(12) United States Patent
Usui et al.

(10) Patent No.: US 8,088,247 B2
(45) Date of Patent: Jan. 3, 2012

(54) PLASMA PROCESSING APPARATUS

(75) Inventors: Tatehito Usui, Kasumigaura (JP);
Kazuhiro Joo, Kudamatsu (JP); Takashi Fujii, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 931 days.

(21) Appl. No.: 11/371,921

(22) Filed: Mar. 10, 2006

(65) Prior Publication Data
US 2007/0202613 A1    Aug. 30, 2007

(30) Foreign Application Priority Data
Feb. 27, 2006    (JP) .................................. 2006-051058

(51) Int. Cl.
  *H01L 21/00*    (2006.01)
  *C23C 16/00*    (2006.01)
  *C23C 14/00*    (2006.01)
(52) U.S. Cl. ............... 156/345.24; 156/345.25; 118/712
(58) Field of Classification Search ............. 156/345.25, 156/345.24
See application file for complete search history.

(56) References Cited

U.S. PATENT DOCUMENTS

| | | | |
|---|---|---|---|
| 5,658,418 | A | 8/1997 | Coronel et al. |
| 6,081,334 | A | 6/2000 | Grimbergen et al. |
| 6,197,116 | B1 * | 3/2001 | Kosugi ........................... 118/712 |
| 6,815,228 | B2 * | 11/2004 | Usui et al. ........................ 438/14 |
| 2004/0175849 | A1 * | 9/2004 | Tanaka et al. ..................... 438/8 |

FOREIGN PATENT DOCUMENTS

| | | |
|---|---|---|
| JP | 61-053728 | 3/1986 |
| JP | 63-200533 | 8/1988 |
| JP | 05-179467 | 7/1993 |
| JP | 08-274082 | 10/1996 |
| JP | 2000-097648 | 4/2000 |
| JP | 2000-106356 | 4/2000 |
| JP | 2001-343219 | 12/2001 |
| JP | 2003-083720 | 3/2003 |

* cited by examiner

*Primary Examiner* — Ram N. Kackar
(74) *Attorney, Agent, or Firm* — Antonelli, Terry, Stout & Kraus, LLP.

(57) ABSTRACT

A plasma processing apparatus is provided using a method of measuring the thickness of a processed material, by which the actual remaining thickness or etching depth of a processed layer can be correctly measured online. The plasma processing apparatus includes a detector 11 for detecting interference light of multiple wavelengths from a surface of a sample during processing, pattern comparing means 15 for comparing actual deviation pattern data on the interference light obtained at a given time during processing and a plurality of standard deviation patterns corresponding to two or more thicknesses of the film, and calculating a deviation, the standard deviation patterns corresponding to interference light data of multiple wavelengths obtained, before the processing of the sample, for processing of another sample, deviation comparing means 115 for comparing the deviation between the data and a predetermined deviation and outputting data on a thickness of the film of the sample at that time, remaining-thickness time-series data recording means 18 for recording, as time series data, the data on the thickness of the film, and an endpoint decision unit 230 for deciding completion of a predetermined amount of etching by using the data on the thickness of the film.

2 Claims, 15 Drawing Sheets

PLASMA PROCESSING APPARATUS

The present application is based on and claims priority of Japanese patent application No. 2006-051058 filed on Feb. 27, 2006, the entire contents of which are hereby incorporated by reference.

BACKGROUND OF THE INVENTION

1. Field of the Invention

The present invention relates to a method of measuring a thickness and an etching depth in which the etching amount of a processed material is detected by emission spectroscopy in the manufacturing of a semiconductor integrated circuit or the like, and particularly relates to a method and apparatus for measuring the depth and thickness of a processed material, by which the amount of etching of each layer formed on a substrate by etching using plasma discharge is correctly measured and a desired thickness and etching depth are suitably obtained, and a method and apparatus for processing a processed material using the same.

2. Description of the Related Art

In the manufacturing of semiconductor wafers, dry etching is widely used for removing layers made of various materials, particularly layers of dielectric materials formed on wafer surfaces, or used for forming patterns. In the control of process parameters, it is the most important to accurately determine an etching endpoint for stopping etching at a desired thickness t and etching depth during the processing of these layers.

During the dry etching of a semiconductor wafer, emission intensity at a specific wavelength in plasma light changes with the progress of etching of a specific film. As a method of detecting the etching endpoint of a semiconductor wafer, the following conventional method is available: a change in emission intensity at a specific wavelength is detected from plasma during dry etching and the etching endpoint of a specific film is detected based on the detection result. In this case, it is necessary to prevent erroneous detection caused by a detection waveform which fluctuates with noise. A method of accurately detecting a change in emission intensity includes a detecting method conforming to the method of moving average (for example, refer to Japanese Patent Laid-Open No. 61-53728 (Patent Document 1)) and a method of reducing noise by primary approximation according to the method of least squares (for example, refer to Japanese Patent Laid-Open No. 63-200533 (Patent Document 2)).

As the recent designs of semiconductors become finer with higher densities and higher integration, an aperture ratio (the etched area of a semiconductor wafer) decreases and emission intensity becomes weak at a specific wavelength captured from an optical sensor to a photodetector. As a result, the level of a sampling signal from the photodetector decreases and it is difficult for an endpoint decision unit to positively detect the endpoint of etching based on the sampling signal from the photodetector.

When detecting the endpoint of etching and stopping processing, actually it is important that the remaining thickness of a dielectric layer is equal to a predetermined value. In the conventional process, the overall process is monitored according to time-thickness control technique predicated on a constant etching speed of each layer. The etching speed is determined by, for example, processing a sample wafer beforehand. In this method, the etching process is stopped according to time supervision after the passage of time corresponding to a predetermined etching thickness.

However, it is known that an actual film, for example, an $SiO_2$ film formed by low pressure chemical vapor deposition (LPCVD) has a less reproducible thickness. The tolerance of a thickness in process fluctuation of LPCVD corresponds to about 10% of the initial thickness of the $SiO_2$ film. Therefore, the actual final thickness of the $SiO_2$ film remaining on a silicon substrate cannot be correctly measured by the method of time supervision. The actual thickness of the remaining layer is finally measured by a technique using a standard spectral interferometer. When excessive etching is found, the wafer is discarded as a reject.

Further, it is known that an insulating film etching device degrades with time. For example, the etching speed is reduced by repeated etching and etching may be stopped halfway. Such a problem has to be solved. In addition, it is also important to monitor the time variations of the etching speed to achieve stable process operation. In the conventional method, only time is monitored to decide an endpoint and no proper method is available for the time variations and fluctuations of the etching speed. Moreover, when deciding an end point for a short etching time of 10 seconds, it is necessary to shorten preparation time for decision and sufficiently reduce segments of decision time, which has not been sufficiently achieved in the conventional method. In many cases, an insulating film has an etched area of 1% or less and a small change in the intensity of plasma radiation from a reaction product generated by etching. Therefore, an endpoint decision system capable of detecting a small change is necessary but no practical and inexpensive system is available.

In other methods, the etching endpoint of a semiconductor wafer is detected using an interferometer. In a first method, interference light (plasma light) is detected using color filters of red, green and blue to detect the endpoint of etching (for example, refer to Japanese Patent Laid-Open No. 5-179467 (Patent Document 3)). In a second method, the extreme values of an interference waveform (the maximum and minimum points of the waveform and 0 point of a differential waveform) are counted using the time variations of the interference waveform of two wavelengths and the differential waveform. An etching speed is calculated by measuring a time until the count reaches a predetermined value, the remaining etching time until a predetermined thickness is determined based on the calculated etching speed, and the etching process is stopped according to the etching time (for example, refer to Japanese Patent Laid-Open No. 8-274082 (U.S. Pat. No. 5,658,418) (Patent Document 4)). In a third method, a difference waveform is determined (using a wavelength as a parameter) between a light intensity pattern of interference light before processing (using a wavelength as a parameter) and a light intensity pattern of interference light after processing or during processing, and a height difference (thickness) is measured by comparing the difference waveform and a difference waveform in a database (for example, refer to Japanese Patent Laid-Open No. 2000-97648 (Patent Document 5)). A fourth method relates to a rotary coating applicator. In this method, the time variations of interference light of multiple wavelengths are measured to determine a thickness (for example, refer to Japanese Patent Laid-Open No. 2000-106356 (Patent Document 6)). In a fifth method, the characteristic time variations of interference light are determined by measurement and stored in a database, the end of etching is decided by comparing the database and a measured interference waveform, and the change of etching process conditions is accelerated by the decision (for example, refer to U.S. Pat. No. 6,081,334 (Patent Document 7)).

In the methods using interferometers, monochromatic radiation from a laser is incident at a vertical incidence angle on a wafer including a laminated structure of different materials. For example, on a wafer where an $SiO_2$ layer is stacked on an $Si_3N_4$ layer, interference fringes are formed by radiation reflected on the top surface of the $SiO_2$ layer and radiation reflected on the boundary surface between the $SiO_2$ layer and the $Si_3N_4$ layer. The reflected radiation is emitted to a proper detector and generates a signal which is varied in thickness with the thickness of the $SiO_2$ layer during etching. When the top surface of the $SiO_2$ layer is exposed during an etching process, the etching speed and the current etching thickness can be correctly monitored in a continuous manner without delay. In some methods, predetermined plasma radiation is measured instead of laser radiation by spectrometers.

The conventional techniques cause the following problems:

A. When a thickness is decided in a thickness processing process (resist etchback or the like with a thickness of several μ), the time variations of interference light become complicated to several periods or more, and thus even a small disturbance affects the decision.

B. When a thickness is decided in a thickness processing process (etchback or the like of a gate oxide film or an oxide film), it is necessary to measure a small change of interference light and a small disturbance affects the decision. In other words, the time variations of interference light are ½ to ¼ periods or less during the processing of a thin film, interference fringes slightly change, and the influence of noise has to be eliminated to decide a thickness.

C. On a processed wafer for mass production, peripheral circuits are mixed and various materials (mask material, etched material, and other materials on the peripheral circuits) are etched at the same time. Thus, interference light from different materials are superimposed in a complicated manner, the various materials are varied in thickness in a lot or between lots of processed wafers, and the time variations of interference light are changed in a lot or between lots during etching.

D. When producing small batches of a variety of products, various etching processes are mixed and thus an etching device is likely to degrade with time and cause abnormal discharge and change of plasma. For this reason, plasma radiation changes and disturbance is superimposed on interference light, which affects a decision.

In consideration of these points, it has been difficult to correctly measure and control the remaining amount or etching depth of a processed layer with a desired measurement accuracy, particularly a processed layer in plasma etching.

It is an object of the present invention to provide an etching endpoint decision method using a method of measuring the thickness or etching depth of a processed material, a plasma processing apparatus for implementing the endpoint decision method, by which the actual remaining amount or etching depth of the processed layer can be correctly measured during plasma etching in a process of manufacturing a semiconductor device, and a plasma processing method and apparatus using the same.

Another object of the present invention is to provide an etching method which makes it possible to correctly control each layer of a semiconductor device online to a predetermined thickness and a predetermined etching depth in a process of manufacturing the semiconductor device.

Still another object of the present invention is to provide a device for measuring the thickness or etching depth of a processed material whereby the actual thickness and etching depth of a processed layer can be correctly measured online in a process of manufacturing a semiconductor device.

SUMMARY OF THE INVENTION

In order to solve the problems of the conventional technique and attain the objects of the present invention, the inventors et al. devised a solution for preventing a malfunction in the following case: the time differential waveform of an interference waveform is obtained for multiple wavelengths and a pattern indicating the wavelength dependence of the differential values of the interference waveform (that is, a differential value pattern of the interference waveform using a wavelength as a parameter) is obtained based on the waveform, and a thickness is measured using the pattern.

1) No comparison is made with a standard pattern having an etching amount not larger than the target etching amount in a database of standard patterns of interference waveforms corresponding to etching amounts (thicknesses or depths) of an etched material.

2) A standard deviation is monitored in pattern matching of a standard pattern and an interference waveform pattern measured in etching. When the deviation is large, an etching amount at that time is estimated from a change in the past etching amount.

3) When an etching amount determined by pattern matching with a standard pattern is considerably different from an amount estimated from a change in the past etching amount, an etching amount at that time is estimated from a change in the past etching amount.

4) An etching speed determined by a change in the past etching amount is compared with the etching speed of the database of standard patterns. When the etching speeds are considerably different from each other, an etching amount at that time is estimated from a change in the past etching amount.

The pattern indicating the wavelength dependence of a time differential value of the interference waveform is used in the present invention because measurement is predicated on in-situ (real time) measurement during etching. The thickness of a processed film changes with time. Therefore, time differentiation can be performed on the interference waveform to reduce, on a measurement window, the influence of contamination, a cut and the like which cause problems in the measurement of interference light intensities. It is not always necessary to perform time differentiation on the interference waveform.

Further, when plasma radiation rapidly changes due to abnormal discharge caused by aging of the apparatus, an amount of change (ratio: correction coefficient) is obtained by comparison with a past emission waveform, emission waveforms thereafter are corrected by the correction coefficient, and an etching amount is measured using interference light or the endpoint of etching is decided using plasma radiation.

In order to solve the problems of the conventional technique and attain the objects of the present invention, the inventors et al. devised the following method of measurement: the time series waveforms of the time differentiation of interference waveforms are obtained for the multiple wavelengths of reflected light from a sample (semiconductor device) during plasma processing, a pattern indicating the wavelength dependence of differential values of the interference waveform is obtained based on the time series waveforms, that is, a pattern is obtained where the differential values of the interference waveform using a wavelength as a parameter are arranged in time series, and a thickness is measured using a plurality of standard differential waveform patterns corresponding to two or more thicknesses of a processed film of the sample. In the standard differential waveform patterns, differential values are arranged in time series which are obtained, before the processing of the sample, by differentiating a change in the intensity of interference light of multiple wavelengths for processing of another sample.

In the present invention, a pattern indicating the wavelength dependence of the time differential values of the interference waveform is used for the following reasons:

A. In the present invention, measurement is predicated on in-situ (real time) measurement during etching. Thus, the remaining thickness of a processed film changes with time and time differentiation can be performed on the remaining thickness by using the interference waveform, and noise can be removed from the interference waveform by the differentiation.

B. Since the index of refraction of an etched material (for example, a nitride film of silicon and a mask material) is different relative to a waveform, the characteristic changes (thickness dependence) of the materials can be detected by measuring interference light of multiple wavelengths.

According to an aspect of the present invention, a method of measuring a remaining thickness and a method of measuring an etching depth, which act as a method of measuring an etching amount of a processed material, comprise:

A. a step of setting a standard differential pattern $P_S$ in which a parameter is a wavelength of a differential value of interference light relative to a predetermined etching amount of a first (sample) processed material, B. a step of setting a standard differential pattern $P_M$ in which a parameter is a wavelength of a differential value of interference light relative to a predetermined etching amount of a mask material for preventing the first processed material from being cut, C. a step of measuring intensities of interference light of multiple wavelengths for a second processed material for etching, and obtaining an actual differential pattern (Pr) in which a parameter is the wavelength of the differential value of the measured interference light intensity, the second processed material having the same configuration as the first processed material, and D. a step of determining the etching amount of the second processed material based on the standard differential patterns ($P_S$ and $P_M$) and the actual differential pattern (Pr) of the differential value.

According to the present invention, it is possible to provide a method of measuring the remaining thickness or etching depth of a processed material, by which the actual etching amount of a processed layer can be correctly measured online in plasma processing, particularly in plasma etching, and a method of processing a sample of a processed material using the same.

Further, it is possible to provide an etching process which makes it possible to accurately control each layer of a semiconductor device online to a predetermined etching amount. Moreover, it is possible to provide a remaining thickness measuring device or an etching depth measuring device which make it possible to accurately measure the actual etching amount of a processed material online.

DETAILED DESCRIPTION OF THE PREFERRED EMBODIMENTS

Figure 1:
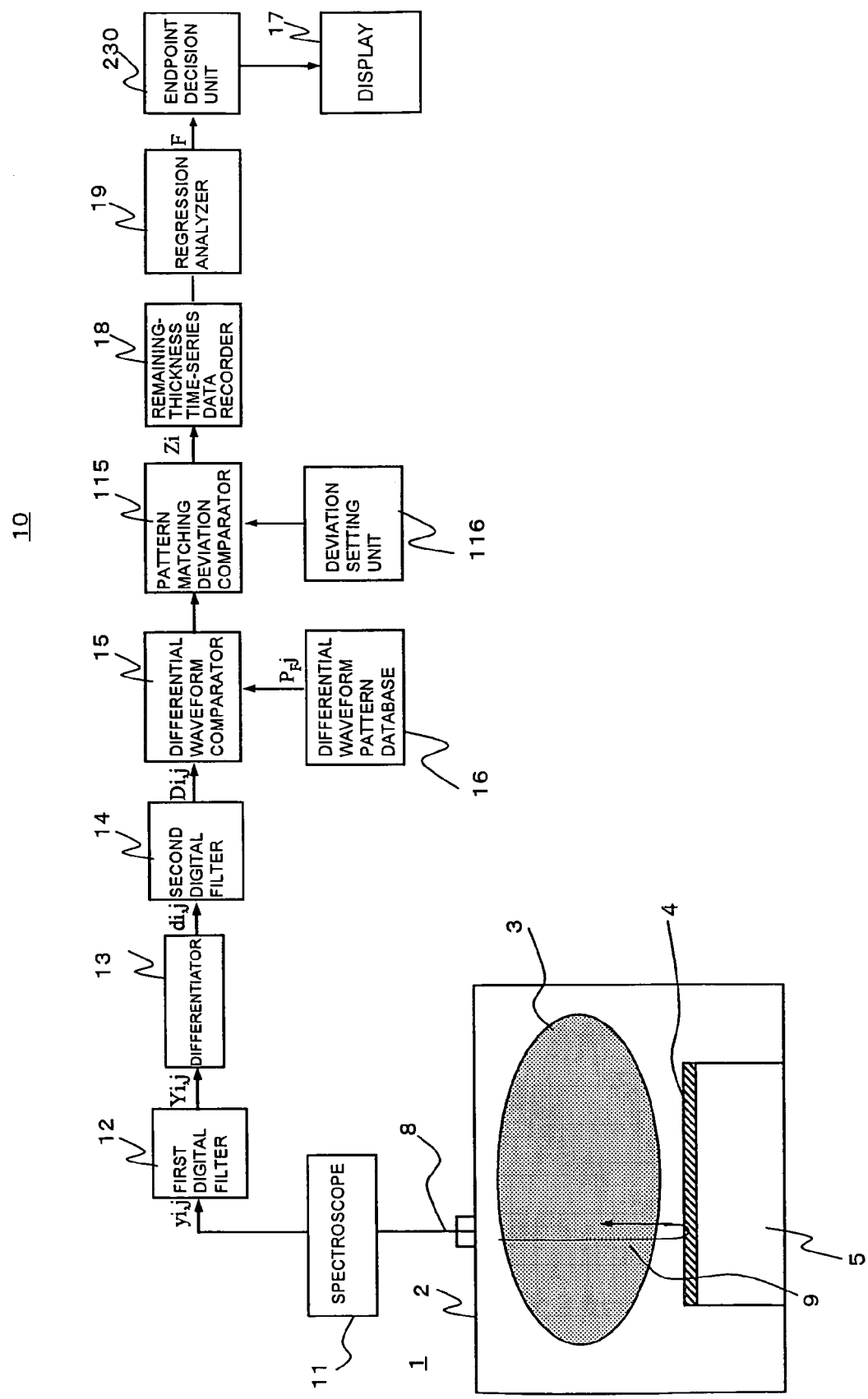
FIG. 1 is a block diagram showing the overall configuration of an etching apparatus of a semiconductor wafer according to Embodiment 1 of the present invention, the etching apparatus comprising an etching amount measuring device.

The following will describe embodiments of the present invention. In the following embodiments, elements having the same functions as Embodiment 1 are indicated by the same reference numerals as Embodiment 1 and the detailed explanation thereof is omitted.

Embodiment 1

Referring to FIGS. 1 to 5, Embodiment 1 of the present invention will be discussed below. In Embodiment 1, when a processed material such as a semiconductor wafer is plasma etched, a standard differential pattern Ps is set which indicates the wavelength dependence of a differential value of interference light (using a wavelength as a parameter) relative to an amount of etching of each layer of a sample processed material (first processed material). And then the intensities of two or more wavelengths of interference light are measured at a given time from the start of plasma etching in actual processing for a processed material (second processed material) which has the same configuration as the sample processed material. An actual differential pattern (Pr) is determined which indicates the wavelength dependence of the differential value of the measured intensities of interference light (using a wavelength as a parameter). The standard differential pattern (Ps) and the actual differential pattern (Pr) of the differential values are compared with each other to determine the amount of etching of the processed material.

First, referring to FIG. 1, the following will discuss the overall configuration of a plasma processing apparatus which comprises an etching amount (the remaining thickness of a mask member or the etching depth of silicon) measuring device and acts as an etching apparatus of a semiconductor wafer on which semiconductor devices are formed. An etching apparatus (plasma processing apparatus) 1 comprises a vacuum container 2 in which etching gas introduced from gas introducing means (not shown) is decomposed by microwave power or the like and transformed into plasma 3. A processed material 4 such as a semiconductor wafer on a sample stage 5 is etched by the plasma 3. Radiation of multiple wavelengths is introduced through an optical fibre 8 into the vacuum container 2 from a measurement light source (for example, a halogen light source) included in a spectroscope 11 of an etching amount (the remaining thickness of a mask member or the etching depth of silicon) measuring apparatus 10, and the radiation is emitted to the processed material 4 at a vertical incidence angle. Interference light from the processed material 4 is introduced to the spectroscope 11 of the etching amount measuring apparatus 10 through the optical fibre 8. According to the state of the light, the etching depth of silicon or the remaining thickness of the mask member is measured and the endpoint of etching is decided.

The etching amount measuring apparatus 10 comprises the spectroscope 11, a first digital filter circuit 12, a differentiator 13, a second digital filter circuit 14, a differential waveform comparator 15, a differential waveform pattern database 16, a pattern matching deviation comparator 115, a deviation setting unit 116, a remaining-thickness time-series data recorder 18, a regression analyzer 19, an endpoint decision unit 230, and a display 17 for displaying the results of the endpoint decision unit. FIG. 1 shows the functional configuration of the etching amount measuring apparatus 10. Actually the etching amount measuring apparatus 10 other than the display 17 and the spectroscope 11 can comprise a CPU, a program for measuring the remaining thickness or a program for measuring the etching depth of silicon, ROM for storing kinds of data from the differential waveform pattern database or the like of interference light, RAM for storing measurement data, a storage device including an external storage device, an input/output device of data, and a communications control unit.

Radiation of multiple wavelengths is introduced through the optical fibre 8 into the vacuum container 2 from the measurement light source (for example, a halogen light source) of the spectroscope 11, and the radiation is emitted to the processed material 4 at a vertical incidence angle. Interference light from the processed material 4 is introduced to the spectroscope 11 of the etching amount measuring apparatus 10 through the optical fibre 8. According to the state of the light, the etching depth of silicon or the remaining thickness is measured and the endpoint of etching is decided.

The radiant intensities of multiwavelength interference light having been captured by the spectroscope 11 are converted, for respective specific wavelengths, to current detection signals according to the radiant intensities and then converted to voltage signals. Signals outputted as sampling signals with two or more specific wavelengths (j wavelengths) from the spectroscope 11 are stored as time series data yi,j in a storage device such as RAM (not shown). Time series data yi,j at time i is then smoothed by the first digital filter circuit 12 and stored as smoothed time series data Yi,j in a storage device such as RAM (not shown). Based on the smoothed time series data Yi,j, time series data di,j of differential coefficients (primary differential value or secondary differential value) is calculated by the differentiator 13 and stored in a storage device such as RAM (not shown). The time series data di,j of differential coefficients is smoothed by the second digital filter circuit 14 and stored as smoothed differential coefficient time-series data Di,j in a storage device such as RAM (not shown). Then, an actual differential pattern (Prj)=Σj(Di,j) indicating the wavelength dependence of differential values of interference light intensities (using wavelengths j as parameters) is determined from the smoothed differential coefficient time-series data Di,j.

In the differential waveform pattern database 16, differential waveform pattern data values Psj of interference light intensities are set for the respective wavelengths corresponding to etching depths, each being denoted as a remaining thickness s of a processed material in which an etching amount is measured. The differential waveform pattern data values Psj have been obtained beforehand using the first (sample) processed material. In the differential waveform comparator 15, the actual differential pattern Prj=Σj(Di,j) and the differential waveform pattern data value Psj of the thickness s are compared with each other. In the pattern matching deviation comparator 115, a (minimum) pattern matching deviation σs is determined so as to minimize a pattern matching deviation (σs=√(Σj(Di,j−Psj)×(Di,j−Psj)/j)). The pattern matching deviation σs is compared with a (set) pattern matching deviation $\sigma_0$ having been set in the deviation setting unit 116. When the (minimum) pattern matching deviation σs is equal to or smaller than the (set) pattern matching deviation $\sigma_0$, the thickness s is stored in the thickness time-series data recorder 18 as an instantaneous thickness Zi at time i. When the (minimum) pattern matching deviation σs is equal to or larger than the (set) pattern matching deviation $\sigma_0$, the instantaneous thickness Zi at time i is not stored.

In the regression analyzer 19, a calculated thickness F at time i is determined based on a regression linear approximation using instantaneous thickness data before time i. The endpoint decision unit 230 decides whether the calculated thickness F is equal to or smaller than a predetermined target thickness. The amount of etching of the processed material is determined thus and the result is displayed on the display 17.

In Embodiment 1, only the single spectroscope 11 is provided. When widely measuring and controlling the plane of the processed material, two or more spectroscopes 11 may be provided.

Figure 2:
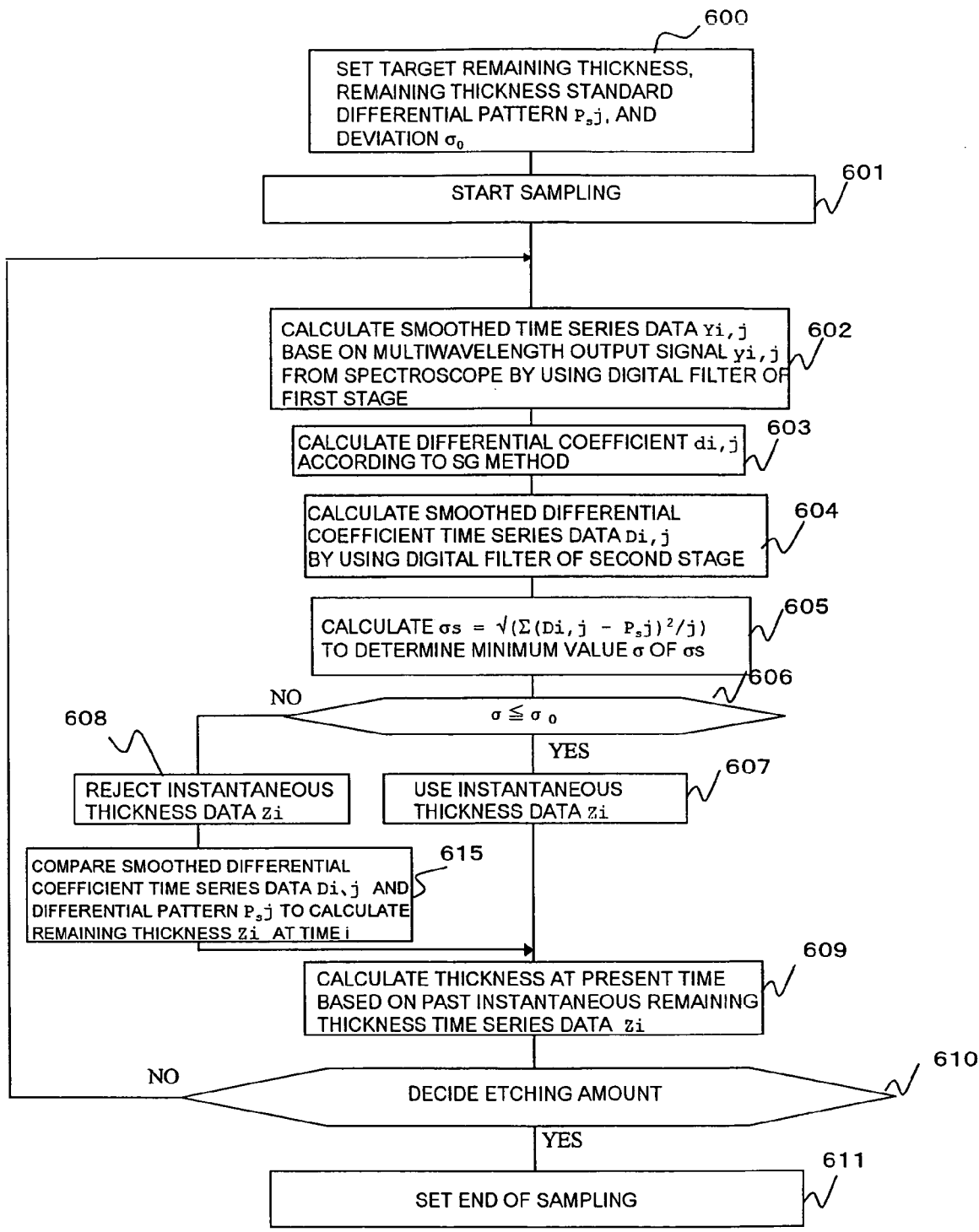
FIG. 2 is a flowchart showing the steps of determining the remaining thickness of a processed material when performing etching using the etching amount measuring device of FIG. 1.

Referring to the flowchart of FIG. 2, the following will discuss the steps of determining the etching amount of a processed material when performing etching in the etching amount measuring apparatus 10 of FIG. 1.

First, a target etching amount (target remaining thickness) is set, a differential pattern (remaining thickness standard differential pattern) Psj with wavelength ranges (at least three wavelength ranges) extracted from the differential waveform pattern database 16 is set, and a (set) pattern matching deviation $\sigma_0$ is set (step 600). In other words, the standard differential pattern Psj is set in the differential waveform pattern database 16 so as to correspond to an etching amount (remaining thickness) s required for the processing conditions of the processed material.

In the subsequent step, sampling is started (for example, every 0.25 to 0.5 seconds) on interference light from the processed material (step 601). In other words, a sampling start command is issued in response to the start of etching. The radiant intensities of multiple wavelengths are detected by the photodetector (spectroscope 11) as light detection signals of voltages corresponding to the radiant intensities. The radiant intensities change with the progress of etching. The light detection signals of the respective wavelengths j in the spectroscope 11 are converted to digital signals to obtain sampling signals yi,j.

And then, multiwavelength output signals yi,j from the spectroscope 11 are smoothed by the digital filter 12 of the first stage to calculate smoothed time series data Yi,j (step 602). In other words, noise is reduced by the digital filter of the first stage to determine the smoothed time series data Yi,j.

Subsequently, in the differentiator 13, the smoothed time series data Yi,j is differentiated to calculate a differential coefficient di,j for each wavelength according to SG method (step 603). In other words, the differential coefficient (primary or secondary) di,j of a signal waveform is determined for each wavelength according to differentiation (SG method). Further, the digital filter 14 of the second stage calculates smoothed differential coefficient time series data Di,j (step 604). Then, a (minimum) matching pattern deviation $\sigma s = \sqrt{(\Sigma(Di,j-Psj)^2/j)}$ is calculated in the differential waveform comparator 15 to obtain the minimum value $\sigma$ of the (minimum) matching pattern deviation $\sigma s$ relative to the remaining thickness s (step 605).

Subsequently, in the pattern matching deviation comparator 115, whether $\sigma \leq \sigma_0$ is satisfied is decided to compare the (minimum) calculated matching pattern deviation $\sigma$ and the (set) matching pattern deviation $\sigma_0$ (step 606). In the case of $\sigma \leq \sigma_0$, it is decided that the thickness of the processed material reaches the remaining thickness s and the instantaneous thickness Zi at time i is stored in the remaining-thickness time-series data recorder 18 (step 607). When $\sigma \leq \sigma_0$ is not satisfied, the instantaneous thickness Zi at time i is not determined from the database of the standard differential pattern and the instantaneous thickness is not stored in the remaining-thickness time-series data recorder 18 (step 608). The smoothed differential coefficient time series data Di,j and the differential pattern Psj set beforehand in the differential waveform comparator 15 are compared with each other and the remaining thickness Zi at that time is calculated (step 615).

And then, primary regression line Y=Xa×t+Xb (Y: remaining thickness, t: etching time, Xa: etching speed of absolute value, Xb: initial thickness) is determined by the regression analyzer 19 using the time series data Zi having been stored in the past, and the calculated remaining thickness F at time i (at the present time) is calculated based on the regression line (step 609). Subsequently, in the endpoint decision unit 230, the calculated remaining thickness F and the target remaining thickness are compared with each other to determine an etching amount (remaining thickness). When the calculated remaining thickness is equal to or smaller than the target remaining thickness, it is decided that the amount of etching of the processed material reaches a predetermined value and the result is displayed on the display 17 (step 609). When the calculated remaining thickness is equal to or larger than the target remaining thickness, the process returns to step 602. These steps are repeatedly performed. Finally, when the calculated remaining thickness F is equal to or smaller than the target remaining thickness in step 610, the end of sampling is set (step 611).

The following will discuss the calculation of the smoothed differential coefficient time series data Di at time i at a certain wavelength j. The first digital filter circuit 12 is, for example, a secondary Butterworth low-pass filter. Smoothed time series data Yi is determined by the secondary Butterworth low-pass filter according to Formula (1) below.

$$Yi = b1yi + b2yi-1 + b3yi-2 - [a2Yi-1 + a3Yi-2] \quad (1)$$

Coefficients b and a vary with a sampling frequency and a cutoff frequency. For example, a2=−1.143, a3=0.4128, b1=0.067455, b2=0.13491, and b3=0.067455 (sampling frequency of 10 Hz, cutoff frequency of 1 Hz) are used or a2=−0.00073612, a3=0.17157, b1=0.29271, b2=0.58542, b3=0.29271 (cutoff frequency of 2.5 Hz) and so on are used.

Time series data di of secondary differential coefficients is calculated by the differentiator (differential coefficient arithmetic circuit) 13 by using polynomial adaptive smoothing differentiation for the time series data Yi of five points according to Formula (2) below:

$$\begin{aligned} &j=2\\ &di = \Sigma wj Yi+j\\ &j=-2 \end{aligned} \quad (2)$$

In this formula, w−2=2, w−1=−1, w0=−2, w1=−1, w2=2 are established.

The smoothed differential coefficient time series data Di is determined by the second digital filter circuit (the filter circuit is a secondary Butterworth low-pass filter and coefficients may be different from the coefficients a and b of the digital filter circuit) 14 by using the time series data di of the differential coefficients according to Formula (3) below:

$$Di = b1di + b2di-1 + b3di-2 - [a2Di-1 + a3Di-2] \quad (3)$$

Figure 3:
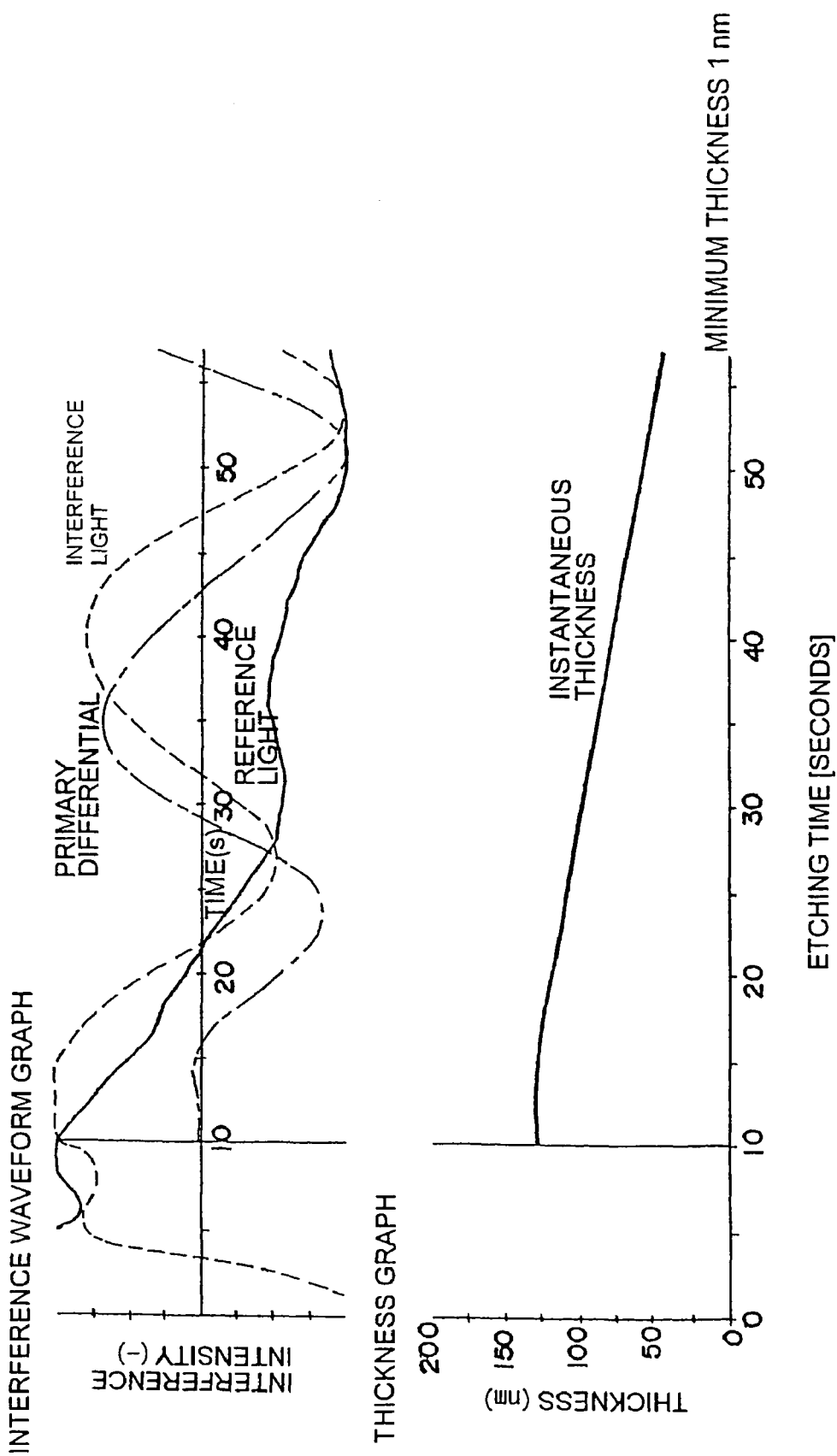
FIG. 3 is a diagram showing the results of the time variations of interference light and reference light (plasma light) and a change in thickness during normal etching according to Embodiment 1 of the present invention.

FIG. 3 shows the relationship between interference intensity and etching time when polysilicon is etched and the thickness of polysilicon is 45 nm. Polysilicon of the etched material has an initial thickness of about 170 nm. FIG. 3 shows an interference light waveform with a wavelength of 500 nm observed from a wafer surface, the primary differential waveform of the interference light waveform, plasma light (reference light) with a wavelength of 500 nm not being observed from the wafer surface, and the time variation (the change of the instantaneous thickness) of the thickness of polysilicon during etching. The time variation is determined by matching with the standard differential pattern. The change of the instantaneous thickness is obtained by comparing a primary differential pattern at each time with a standard differential pattern corresponding to each thickness, selecting the minimum pattern matching deviation, and plotting changes in thickness.

Figure 4:
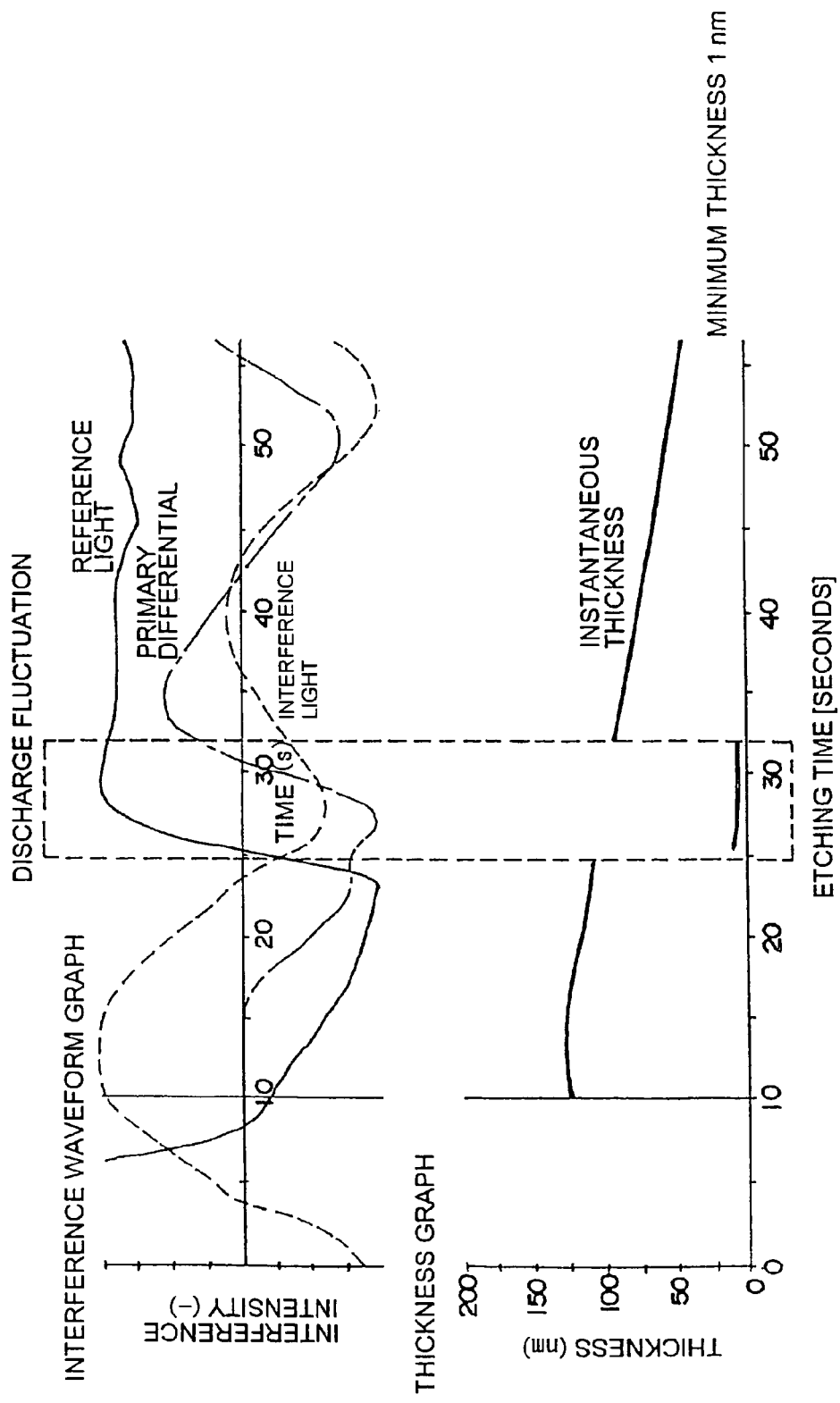
FIG. 4 is a diagram showing the results of the time variations of interference light and reference light and a change in thickness when discharge fluctuates according to Embodiment 1 of the present invention.

FIG. 4 shows the change of the instantaneous thickness during the continuous etching of polysilicon. In FIG. 4, the instantaneous thickness rapidly decreases to about 10 nm from the etching time of about 25 seconds to 31 seconds. This phenomenon occurs because etching plasma or plasma generating power is slightly changed by a reaction product accumulated in a part of the chamber. The instantaneous thickness rapidly decreases only from the etching time of about 25 seconds to 30 seconds. Thereafter, the change of the instantaneous thickness returns to normal and etching is normally completed. In the case where the instantaneous thickness changes thus, for example, the thickness of 45 nm becomes smaller than a decided thickness at 25 seconds, and thus etching is completed at about 100 nm and a defective product is manufactured. Therefore, in a thickness decision system, it is necessary to accurately decide a thickness according to such a change.

In order to prevent the instantaneous thickness from rapidly decreasing, the change of an interference waveform was analyzed. Regarding the change of the interference waveform, generally, a material formed into a thin film eliminates a change of interference light over many wavelength ranges, and thus primary differential changes at these wavelengths simultaneously come close to zero. This change occurs simultaneously, also when plasma changes, over many wavelength ranges. The primary differentiation of the wavelengths simultaneously changes and comes close to zero as the change of plasma decreases. The change of the differentiation is similar to the change of interference light in a thin film. Therefore, in order to prevent such a rapid change, the use of data of small thicknesses is minimized among the standard differential patterns used for measuring a thickness. In other words, pattern matching with the standard differential patterns is performed such that a standard differential pattern having a smaller thickness than a target decided thickness is not used to determine an instantaneous thickness during etching.

Figure 5:
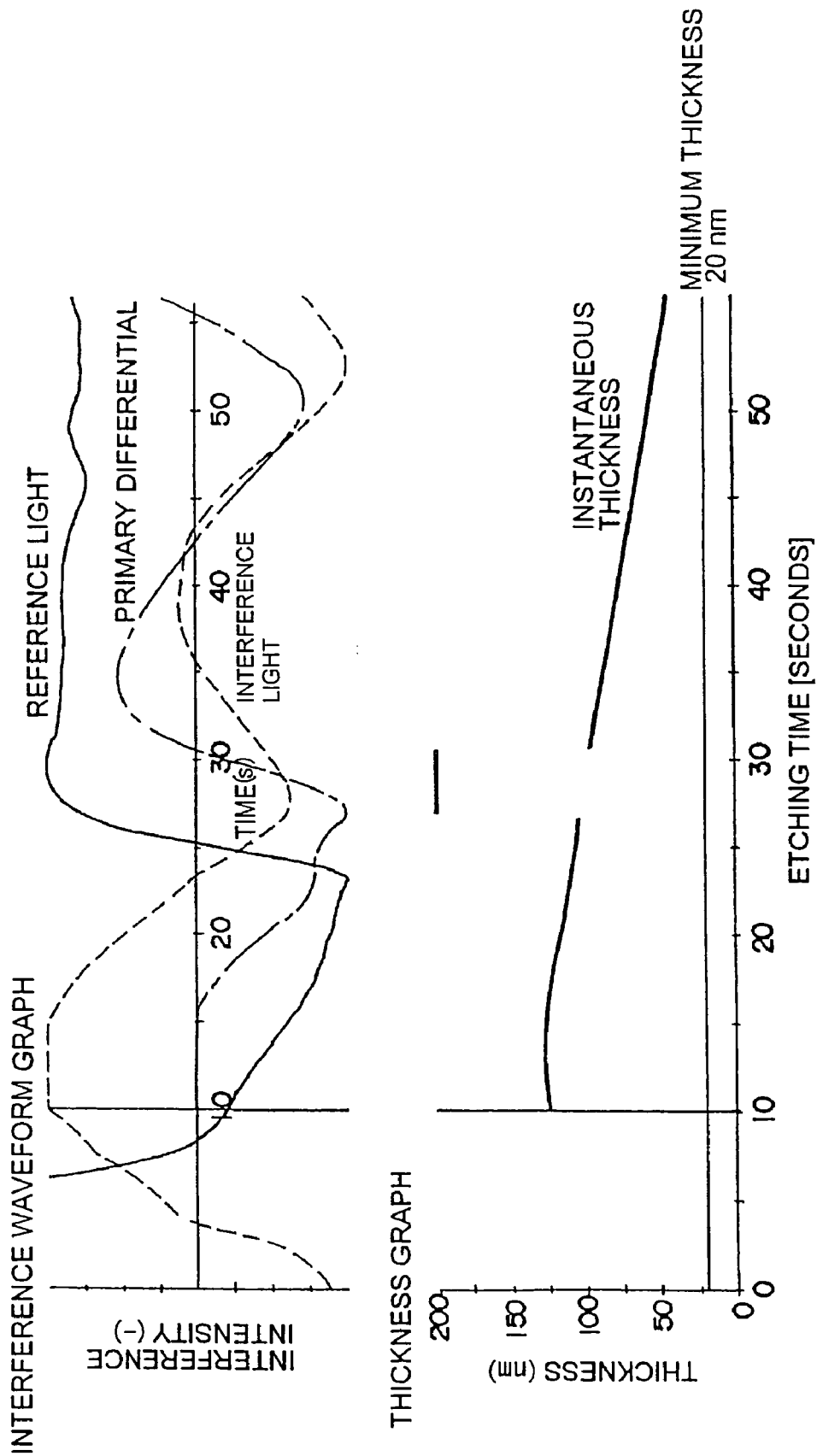
FIG. 5 is a diagram showing the results of the time variations of interference light and reference light and a change in thickness when the minimum thickness is set according to Embodiment 1 of the present invention.

FIG. 5 shows results when the minimum thickness of the standard differential pattern used for pattern matching is 20 nm. As shown in FIG. 5, it is possible to avoid a rapid decrease in thickness from the etching time of about 25 to 30 seconds during which plasma changes. As a result of pattern matching at a certain time of the change, a pattern matching deviation is 0.05 or more. Since there is no thickness where the standard differential pattern and the actual differential pattern match with each other, the initial thickness of the formation of the standard differential pattern is set. In the flowchart of FIG. 2, a standard differential pattern used for the measurement of a thickness is set relative to the thickness as follows: when the target remaining thickness is set in step 600, the minimum thickness of the standard differential pattern is determined according to the target remaining thickness and a standard differential pattern not smaller than the minimum thickness is used.

The following will discuss another embodiment for avoiding change of plasma. This embodiment utilizes a pattern matching deviation which increases when plasma changes. Generally, after etching is started, for a few seconds after the start of differentiation for deciding a thickness, plasma ignition slightly disturbs the interference waveform and reduces a pattern matching deviation $\sigma$. Relative to the (set) pattern matching deviation $\sigma_0$ at that time, a pattern matching deviation $\sigma$ after that time is calculated. When the pattern matching deviation $\sigma$ is larger than the (set) pattern matching deviation $\sigma_0$, it is decided that pattern matching with the standard differential pattern is not sufficient. An instantaneous thickness $Z_i$ is not determined based on the standard differential pattern but set at, for example, the initial thickness of a database (standard deviation pattern). Instantaneous thickness data of the initial thickness at that time is not used for regression line approximation analysis for determining the calculated thickness F.

In this embodiment, the interference light obtained from the external light source is detected. Further, the interference light obtained from the emission of the plasma generated inside the chamber, instead of the external light into the chamber, during the etching process may be used.

Embodiment 2

Figure 6:
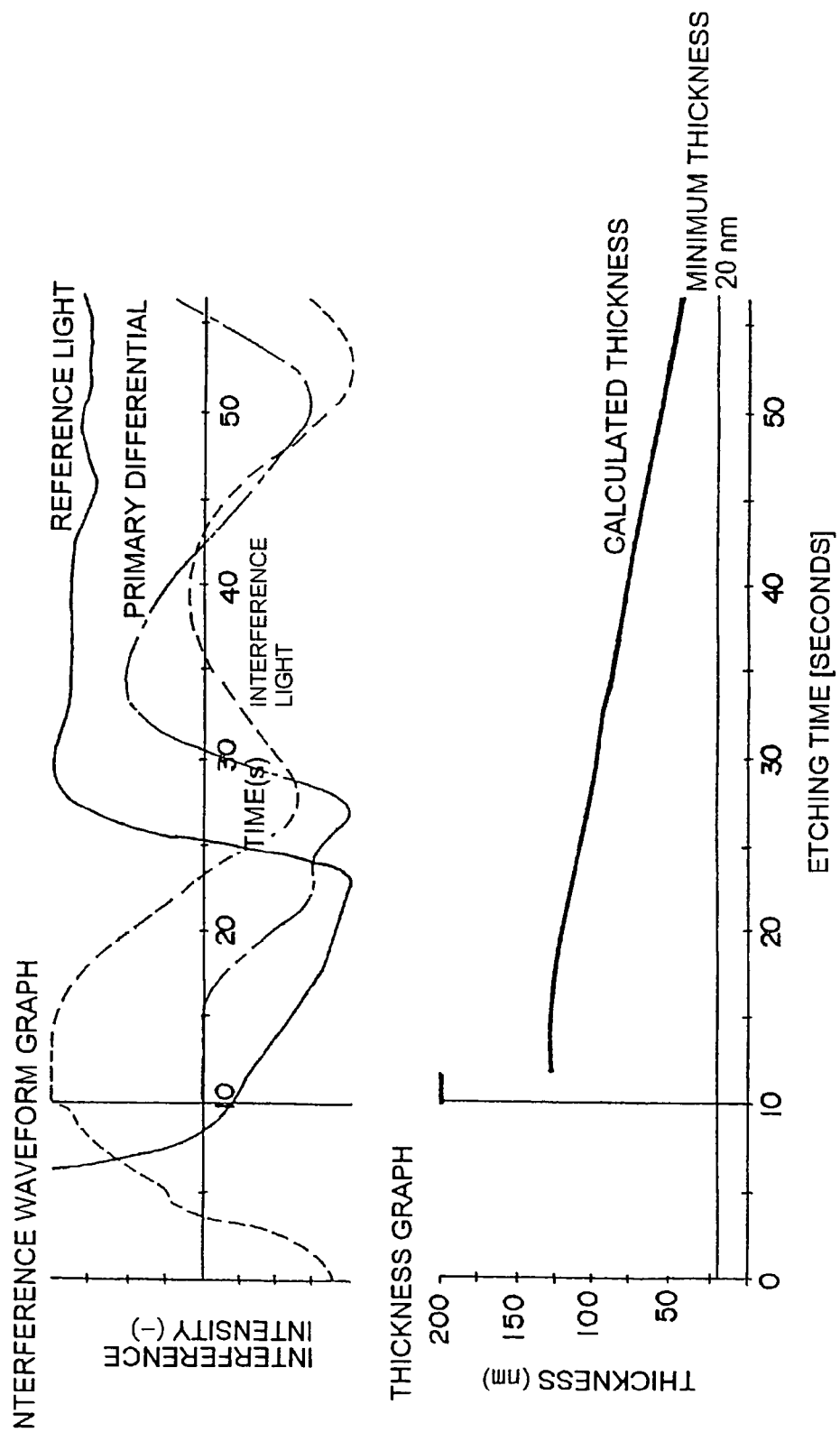
FIG. 6 is a diagram showing the results of the time variations of interference light and reference light and a change in thickness when a pattern matching deviation is obtained according to Embodiment 2 of the present invention.

FIG. 6 shows the results of Embodiment 2 in which an instantaneous thickness $Z_i$ at time i during etching is determined using pattern matching deviation $\sigma_0 = 0.04$ of 2 seconds after the start of differentiation, and a calculated thickness F at time i is calculated from an approximation of a regression line based on the time series data of the instantaneous thickness $Z_i$ before time i. It is understood from FIG. 6 that the determined thickness stably changes without being affected by change of plasma and thus the thickness can be sufficiently decided. In this case, a pattern matching deviation $\sigma_0$ is determined for each processed wafer in a few seconds after the start of differentiation and pattern matching decision is performed. An average of pattern matching deviations $\sigma_0$ may be set in step 600 of the flowchart of FIG. 2 after two or more wafers are processed.

In mass production for processing semiconductor wafers with plasma to manufacture semiconductor devices from the semiconductor wafers, the plasma processing apparatus of the present invention is operated in a continuous manner and conditions in the processing chamber change due to products which are deposited and accumulated on a surface of a material in the processing chamber as the number of processed materials increases. Thus the state of plasma generated in the processing chamber is changed and the shape of a surface obtained by processing is also changed. For this reason, process control for controlling a change of a processed material is necessary in the mass production. In the present embodiment, for such mass production control, the number of times when a pattern matching deviation exceeds a predetermined value is monitored in processing of each wafer which is a processed material, and the number of times is counted with a recorder or a counter (not shown). Such counting may be performed in a pattern matching deviation comparator 115.

Further, by comparing a change in the number of times with a predetermined value (for example, the value of the number of times or a predetermined value of a rate of increase), the state of an apparatus and the state of wafer etching can be recognized. To be specific when the number of times gradually increases, the predetermined value of the number of times is used as an index for starting maintenance such as wet cleaning in a plasma processing apparatus. When the number of times rapidly increases and a rate of increase exceeds the predetermined value, the user is notified or warned of the necessity for processing such as transfer of a wafer to be processed to an inspection step. Such a warning or notification is displayed on the display 17 of FIG. 1 in response to a command from the pattern matching deviation comparator 115.

Embodiment 3

Figure 7:
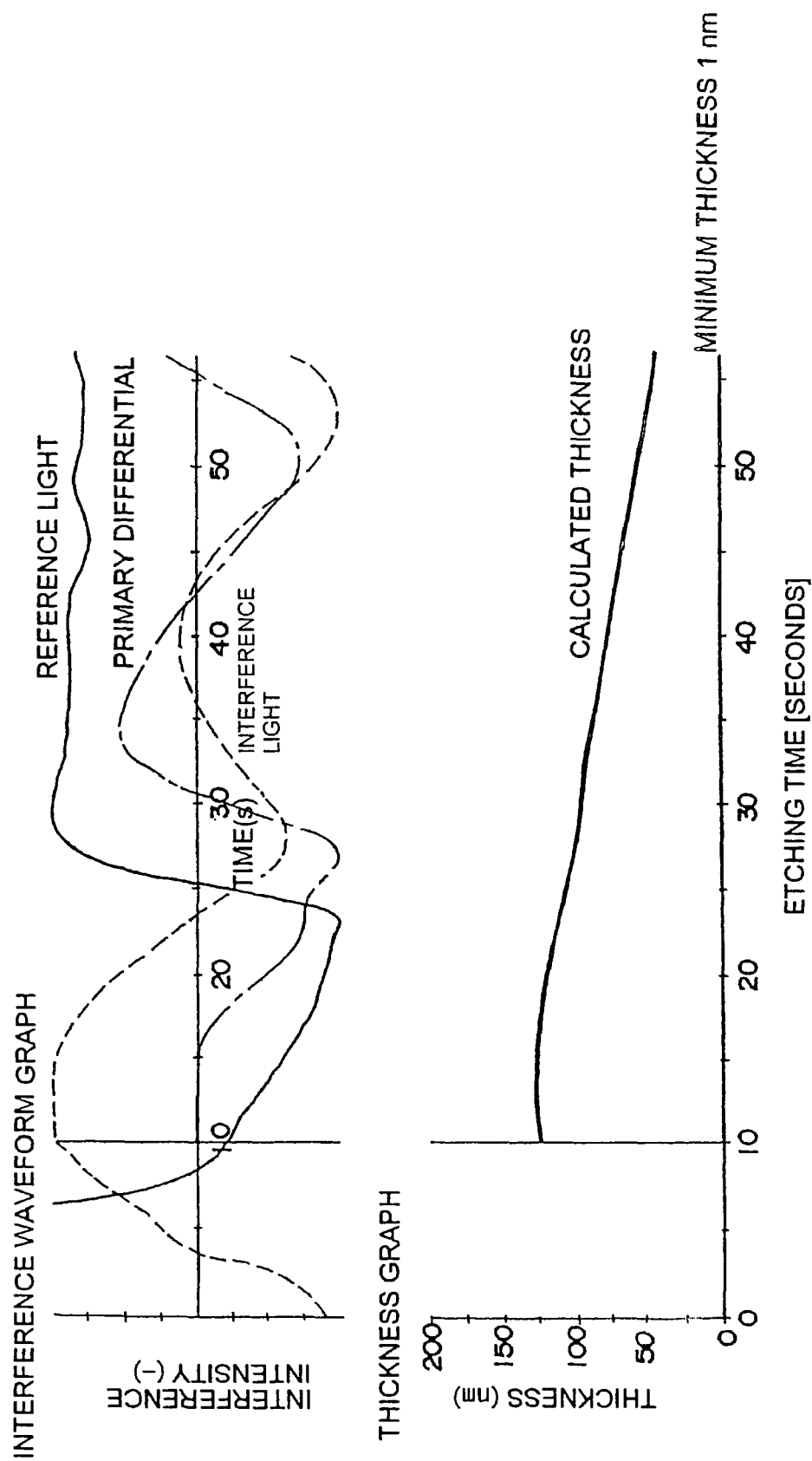
FIG. 7 is a diagram showing the results of the time variations of interference light and reference light and a change in thickness when a permissible thickness is set according to Embodiment 3 of the present invention.

The following will discuss Embodiment 3 for avoiding change of plasma. In the present embodiment, the change of an instantaneous thickness is not stabilized by comparing a pattern matching deviation. After an instantaneous thickness $Z_i$ at time i during etching is determined, when a calculated thickness F at time i is calculated according to a regression line approximation based on time series data of the instantaneous thickness Zi before time i, in the case where a difference (absolute value) between the calculated thickness F and the instantaneous thickness Zi is not smaller than a predetermined permissible thickness, it is decided that the instantaneous thickness Zi at time i is not a correct thickness and the instantaneous thickness Zi is not used for calculating a thickness according to the regression line approximation after time i. The results of this method are shown in FIG. 7. As shown in FIG. 7, this method can similarly prevent a rapid change in thickness from the etching time of about 25 to 30 seconds, during which plasma changes as shown in FIG. 4. In this case, the permissible thickness is 20 nm. The permissible thickness can be set according to a change of an interference waveform during etching. For example, when etching is performed on the initial thickness of 200 nm of polysilicon of an etched material, the interference waveform at the wavelength of 500 nm has a period of about ½ and thus it is only necessary to correctly make a decision within the ¼ period of the interference wave (a differential value has a different sign). The thickness is about 20 nm.

Embodiment 4

Figure 8:
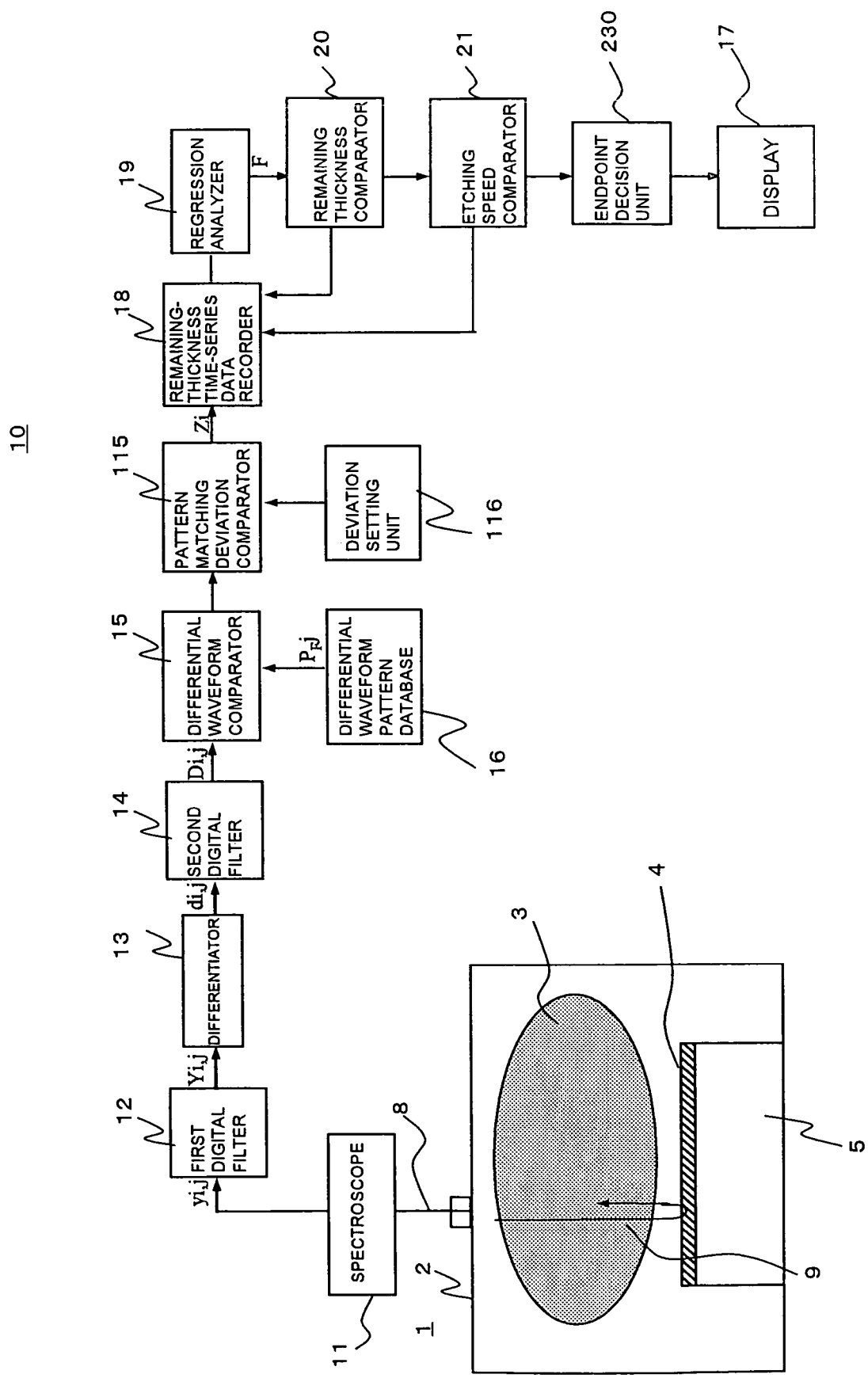
FIG. 8 is a block diagram showing the overall configuration of an etching apparatus of a semiconductor wafer according to Embodiment 4 of the present invention, the etching apparatus comprising an etching amount measuring device for comparisons of thicknesses and etching speeds.
Figure 9:
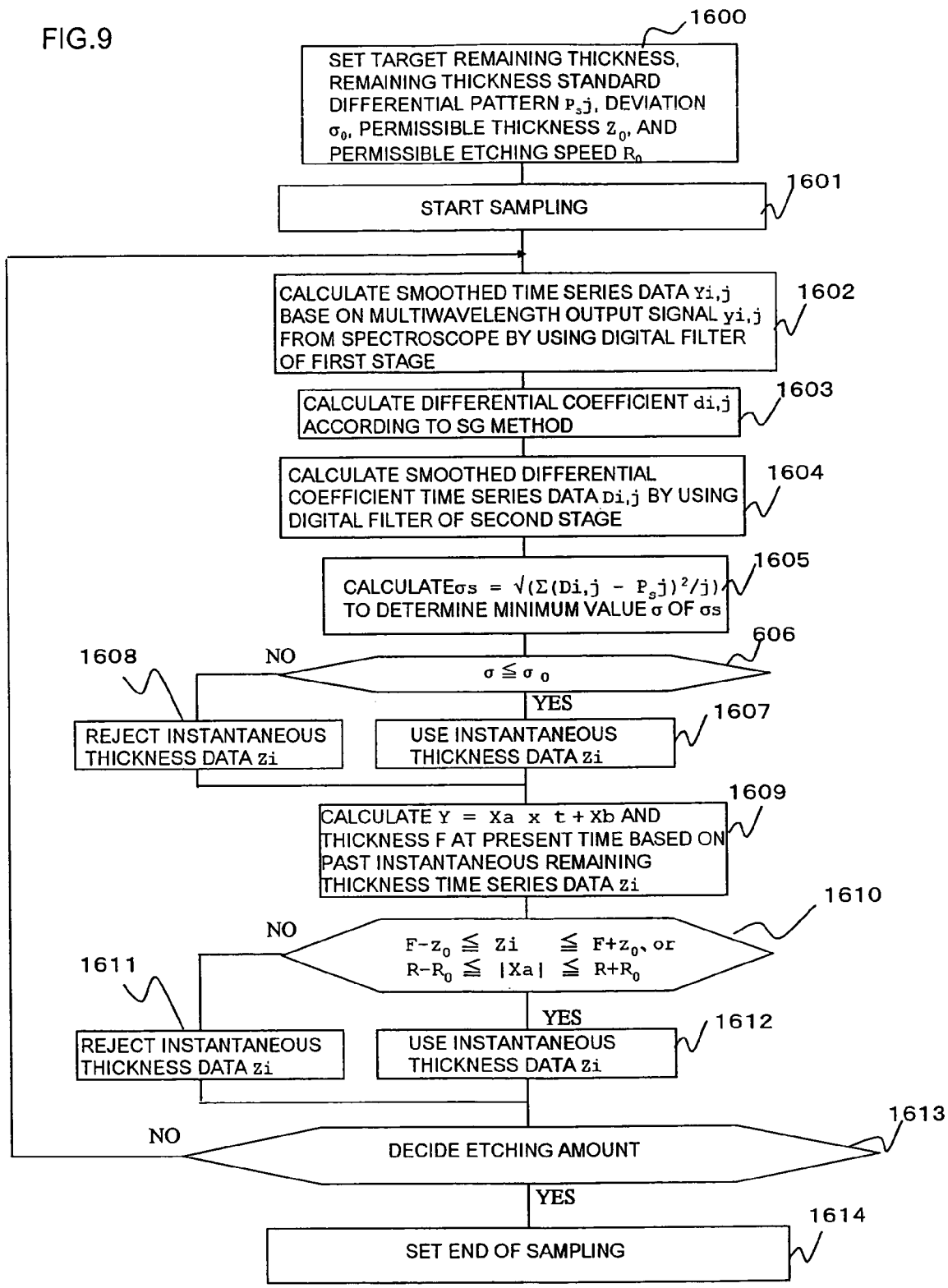
FIG. 9 is a flowchart showing the steps of determining the remaining thickness of a processed material when performing etching using the etching amount measuring device of FIG. 8.

The following will describe Embodiment 4 in which an erroneous decision is avoided in thickness measurement. Embodiment 4 takes advantage of the fact that an etching speed is almost constant during mass production and a change in etching speed is not more than about ±10%. According to the change of the instantaneous thickness of FIG. 3, the slope of the change of an instantaneous thickness Zi is constant in normal etching (32 to 60 seconds) and an etching speed determined by the slope of the change is about 123 nm/min. On the other hand, in a time period (25 to 31 seconds) when plasma changes as shown in FIG. 4, the slope of the change of the instantaneous thickness is smaller than that of normal etching. When an etching speed is doubled or halved in mass production, etching becomes abnormal and thus processing such as wet cleaning has to be performed on an etching device to return the device back to normal. FIG. 8 shows a plasma processing apparatus comprising a thickness decision unit of Embodiment 4. FIG. 9 shows a flowchart for deciding a thickness.

In Embodiment 4, as shown in FIG. 8, a remaining thickness comparator 20 and an etching speed comparator 21 are added between the regression analyzer 19 and the endpoint decision unit 230 of the etching amount measuring apparatus 10 of the plasma processing apparatus shown in FIG. 1.

First, as shown in FIG. 9, a target etching amount (target remaining thickness) is set, a differential pattern (remaining thickness standard differential pattern) Psj with wavelength ranges (at least three wavelength ranges) extracted from a differential waveform pattern database is set, and a (set) pattern matching deviation $\sigma_0$, a permissible thickness $Z_0$, and a permissible etching speed $R_0$ are set (step 1600).

In the subsequent step, sampling is started for interference light (for example, every 0.25 to 0.5 seconds) (step 601). In other words, a sampling start command is issued in response to the start of etching. The radiant intensities of multiple wavelengths are detected by the photodetector as light detection signals of voltages corresponding to the radiant intensities. The radiant intensities change with the progress of etching. The light detection signals of the spectroscope 11 are converted to digital signals to obtain sampling signals yi,j.

And then, a multiwavelength output signal yi,j from a spectroscope 11 is smoothed by a digital filter circuit 12 of the first stage to calculate smoothed time series data Yi,j (step 1602). In other words, noise is reduced by the digital filter of the first stage to determine the smoothed time series data Yi,j.

Subsequently, in a differentiator 13, a differential coefficient di,j is calculated according to SG method (step 1603). In other words, the differential coefficient (primary or secondary) di of a signal waveform is determined according to differentiation (SG method). Further, a digital filter 14 of the second stage calculates smoothed differential coefficient time series data Di,j (step 1604). Then, a (minimum) matching pattern deviation $\sigma s = \sqrt{(\Sigma(Di,j-Psj)^2/j)}$ is calculated in a differential waveform comparator 15 to determine the minimum value $\sigma$ of the (minimum) matching pattern deviation $\sigma s$ relative to a thickness s (step 1605).

Subsequently, in a pattern matching deviation comparator 115, whether $\sigma \leq \sigma_0$ is satisfied is decided to compare the (minimum) calculated matching pattern deviation $\sigma$ and the (set) matching pattern deviation $\sigma_0$ (step 1606). In the case of $\sigma \leq \sigma_0$, it is decided that the thickness of a processed material reaches the thickness s and an instantaneous thickness Zi at time i is stored in a remaining-thickness time-series data recorder 18 (step 1607). When $\sigma \leq \sigma_0$ is not satisfied, the instantaneous thickness Zi at time i is not determined from the database of the standard differential pattern or is not stored in the remaining-thickness time-series data recorder 18 (step 1608).

The etching speed during processing is determined based on the data of the remaining-thickness time-series data recorder 18, and a calculated thickness F and an inclination Xa are determined in a regression analyzer 19 based on regression line approximation (1609). And then, in the remaining thickness comparator 20, it is decided whether the instantaneous thickness Zi is limited by the calculated thickness F and the permissible thickness $z_0$ ($F-z_0 \leq Zi \leq F+z_0$). Alternatively in the etching speed comparator 21, it is decided whether a line inclination Xa determined by regression approximation is an etching speed limited by an etching speed R and a permissible etching speed $R_0$ during the formation of the standard differential pattern ($R-R_0 \leq Xa \leq R+R_0$). When ($F-z_0 \leq Zi \leq F+z_0$) or ($R-R_0 \leq Xa \leq R+R_0$) is satisfied, the instantaneous thickness Zi is stored in the remaining-thickness time-series data recorder 18 (step 1612). The instantaneous thickness Zi is not stored in other cases (step 1611).

Then, a thickness decision is made based on the calculated thickness F. When the calculated thickness F is not larger than the target remaining thickness, it is decided that the etching amount of a processed material reaches a predetermined value and the result is displayed on a display 17 (step 1613). A change in thickness can be indicated by the calculated thickness F during etching. When the thickness is not smaller than the target remaining thickness, the process returns to step 1602. These steps are repeated. Finally the end of sampling is set (step 1614).

Figure 10:
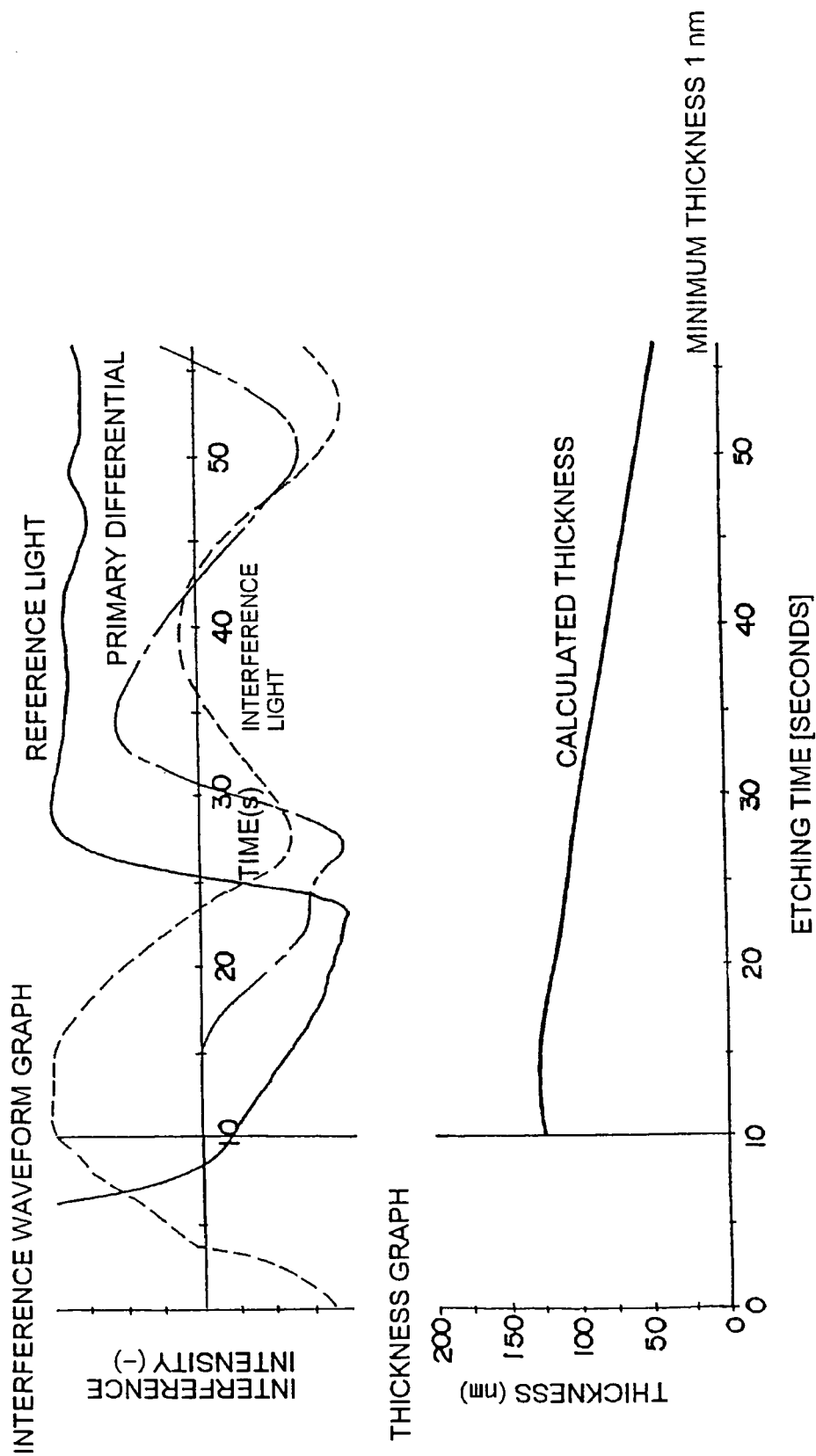
FIG. 10 is a diagram showing the results of the time variations of interference light and reference light and a change in thickness when a permissible etching speed is set according to Embodiment 5 of the present invention.

FIG. 10 shows the results of changes of the calculated thickness when the permissible thickness is 20 nm, 50% of the permissible etching speed is set (etching speed is 117 nm/min), and the minimum thickness is 1 nm (target remaining thickness is 50 nm) in Embodiment 4. It is understood from FIG. 10 that the calculated thickness F stably changes without being affected by change of plasma and thus the target thickness of 50 nm can be decided. In this case, the target thickness is a thickness to be obtained by etching and the minimum thickness is the minimum value of decided thicknesses. In the present embodiment, since the permissible thickness is 20 nm, the target remaining thickness is 50 nm±20 nm. When the minimum thickness of 30 nm is detected, a detected thickness smaller than the minimum thickness can be ignored thereafter.

The number of data of instantaneous thicknesses not being stored in the remaining-thickness time-series data recorder 18 is almost zero in normal etching. When the etching characteristics of the etching device change with time, the matching of the interference differential pattern degrades and the number of data not being stored increases. Further, when the specifications of a processed wafer change, pattern matching degrades and the number of data increases. Therefore, in mass production, a display 17 displays the number of data of instantaneous thicknesses not being stored in the remaining-thickness time-series data recorder 18, enabling control of the etching device and production control of processed wafers.

Embodiment 5

The following will describe Embodiment 5 in which a thickness is decided after the correction of interference light or reference light (plasma light) which is observed when plasma changes. Interference light changes due to plasma radiation which rapidly changes when plasma changes (abnormality). As shown in FIGS. 4 and 5, it may become difficult to obtain, for example, a correct thickness. Moreover, digital filter processing or polynomial adaptive smoothing differentiation is used to improve the S/N ratio of an observed optical signal, and thus a rapid change in radiation is reduced by the processing and affected for a longtime. In order to avoid this influence, digital filter processing or polynomial adaptive smoothing differentiation may be suspended in the event of a rapid change of plasma radiation. However, the instantaneous thickness cannot be determined due to the suspension of the processing and thus a thickness decision cannot be made.

The following will describe a method of detecting a rapid change of plasma, determining an amount of change at each wavelength used for measurement, correcting an optical signal of each wavelength according to each amount of change, performing processing such as digital filter processing and polynomial adaptive smoothing differentiation on the corrected optical signal, and determining a thickness.

When collecting standard pattern data which is a database for deciding a thickness, regarding radiation data in which the time variations of interference light and reference light are measured, an change of amount (difference from time i−1) at a sampling point of time i is obtained at each wavelength to determine the maximum amount of change of interference light and reference light during etching. A noise threshold value is set at each time of sampling based on the maximum change of amount, and a rapid change of plasma is detected using the noise threshold value.

In the presence of an amount of change not smaller than the noise threshold value, a correction coefficient (intensity ratio: $S_{i,j}=y_{i-1,j}/y_{i,j}$) is determined at each wavelength and an optical signal $y_{i,j}$ is corrected by $y'_{i,j}=S_{i,j} \times y_{i,j}$. Processing such as digital filter processing and polynomial adaptive smoothing differentiation is performed on the corrected $y'_{i,j}$, and an instantaneous thickness $Z_i$ is determined to make a decision.

Figure 11:
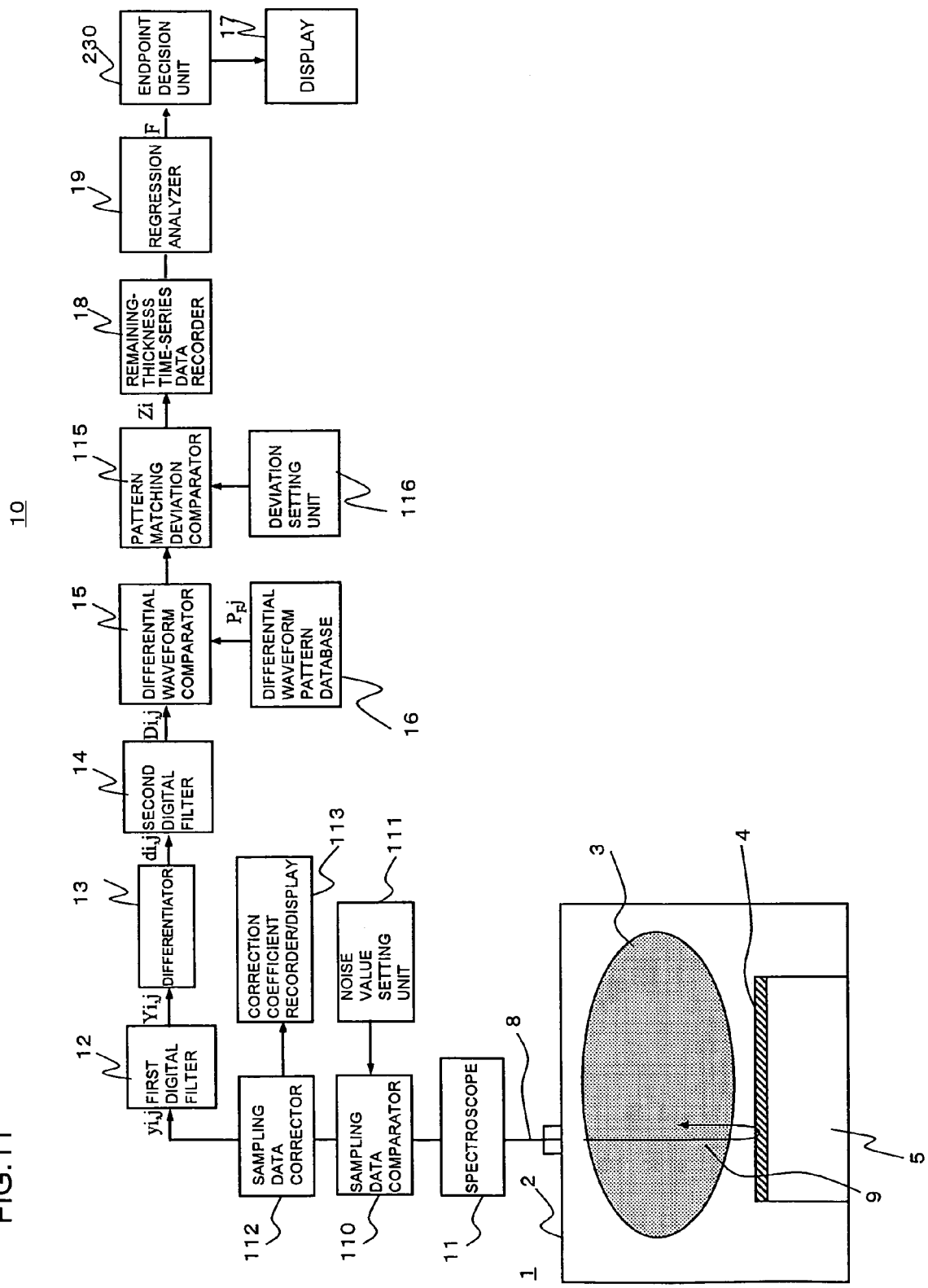
FIG. 11 is a block diagram showing the overall configuration of an etching apparatus of a semiconductor wafer according to Embodiment 5 of the present invention, the etching apparatus comprising an etching amount measuring device.

Referring to FIG. 11, the following will describe the configuration of a plasma processing apparatus for preventing plasma from changing. The plasma processing apparatus comprises a thickness decision unit for deciding a thickness according to Embodiment 6. An etching apparatus 1 comprises a vacuum container 2 in which introduced etching gas is decomposed by microwave power or the like and transformed into plasma 3. A processed material 4 such as a semiconductor wafer on a sample stage 5 is etched by the plasma 3. Radiation of multiple wavelengths is introduced through an optical fibre 8 into the vacuum container 2 from a measurement light source (for example, a halogen light source) included in a spectroscope 11 of an etching amount (remaining thickness or the etching depth) measuring apparatus 10, and the radiation is emitted to the processed material 4 at a vertical incidence angle. Interference light from the processed material is introduced to the spectroscope 11 of the etching amount measuring apparatus 10 through the optical fibre 8. Based on the state of the interference light, the etching thickness of silicon is measured and the endpoint of etching is decided.

The etching amount measuring apparatus 10 comprises the spectroscope 11, a sampling data comparator 110, a noise value setting unit 111 for setting a noise threshold value, a correction coefficient recorder/display 113, a sampling data corrector 112, a first digital filter circuit 12, a differentiator 13, a second digital filter circuit 14, a differential waveform comparator 15, a differential waveform pattern database 16, a pattern matching deviation comparator 115, a deviation setting unit 116, a remaining-thickness time-series data recorder 18, a regression analyzer 19, an endpoint decision unit 230, and a display 17 for displaying the results of the decision unit.

The radiant intensities of multiple wavelengths having been captured by the spectroscope 11 are converted to current detection signals according to the radiant intensities and then converted to voltage signals. Signals of two or more (j) specific wavelengths are outputted from the spectroscope 11 as sampling signals and compared in the sampling data comparator 110 with a value having been set by the noise value setting unit 111. When a change value of the signal is not smaller than the noise value, time series data $y_{i,j}$ is corrected in the sampling data corrector 112 so as to eliminate the change of the signal. A correction coefficient at that time is stored in the correction coefficient recorder/display 113. In this way, corrected time series data $y'_{i,j}$ of the instantaneously changed signal is stored in a storage device such as RAM. The time series data $y'_{i,j}$ at time i is then smoothed by the first digital filter circuit 12 and stored as smoothed time series data $Y_{i,j}$ in a storage device such as RAM. Based on the smoothed time series data $Y_{i,j}$, time series data $d_{i,j}$ of differential coefficients (primary differential value or secondary differential value) is calculated by the differentiator 13 and stored in a storage device such as RAM. The time series data $d_{i,j}$ of differential coefficients is smoothed by the second digital filter circuit 14 and stored as smoothed differential coefficient time-series data $D_{i,j}$ in a storage device such as RAM. Then, an actual pattern indicating the wavelength dependence of differential values of interference light intensities (using wavelengths as parameters) is determined from the smoothed differential coefficient time-series data $D_{i,j}$.

In the differential waveform pattern database 16, differential waveform pattern data values $P_{sj}$ of interference light intensities are set beforehand for the respective wavelengths each corresponding to a thickness s of a processed material in which an etching amount is measured. In the differential waveform comparator 15, the actual pattern and the differential waveform pattern data value $P_{sj}$ of the thickness s are compared with each other. In the pattern matching deviation comparator 115, a (minimum) pattern matching deviation $\sigma s$ is determined so as to minimize a pattern matching deviation ($\sigma s = \sqrt{(\Sigma j (D_{i,j}-P_{sj}) \times (D_{i,j}-P_{sj})/j)}$). The (minimum) pattern matching deviation as is compared with a pattern matching deviation $\sigma_0$ having been set in the deviation setting unit 116. When the (minimum) pattern matching deviation as is equal to or smaller than the (set) pattern matching deviation $\sigma_0$, a thickness s is stored as an instantaneous thickness Zi at time i in the remaining-thickness time-series data recorder 18. When the (minimum) pattern matching deviation σs is equal to or larger than the (set) pattern matching deviation $\sigma_0$, the thickness s is not stored. In the regression analyzer 19, a calculated thickness F at time i is determined based on a regression line approximation using instantaneous thickness data Zi before time i. The endpoint decision unit 230 decides whether the calculated thickness F is not larger than a predetermined target thickness. The amount of etching of the processed material is determined thus and the result is displayed on the display 17.

[Modification]

Figure 12:
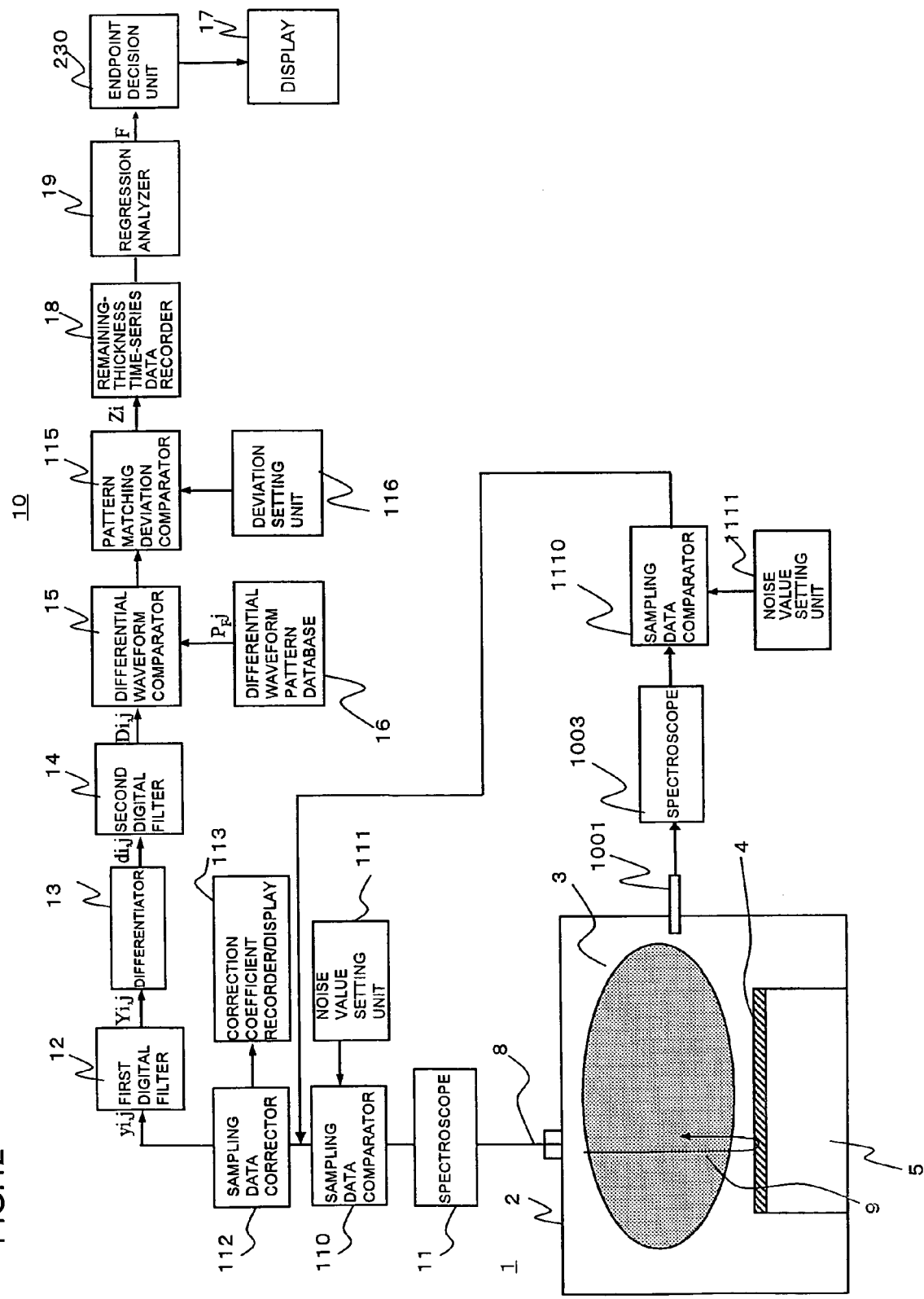
FIG. 12 is a block diagram showing the overall configuration of an etching apparatus of a semiconductor wafer according to a modification of Embodiment 5 of the present invention, the etching apparatus comprising a reference light measuring device.
Figure 13:
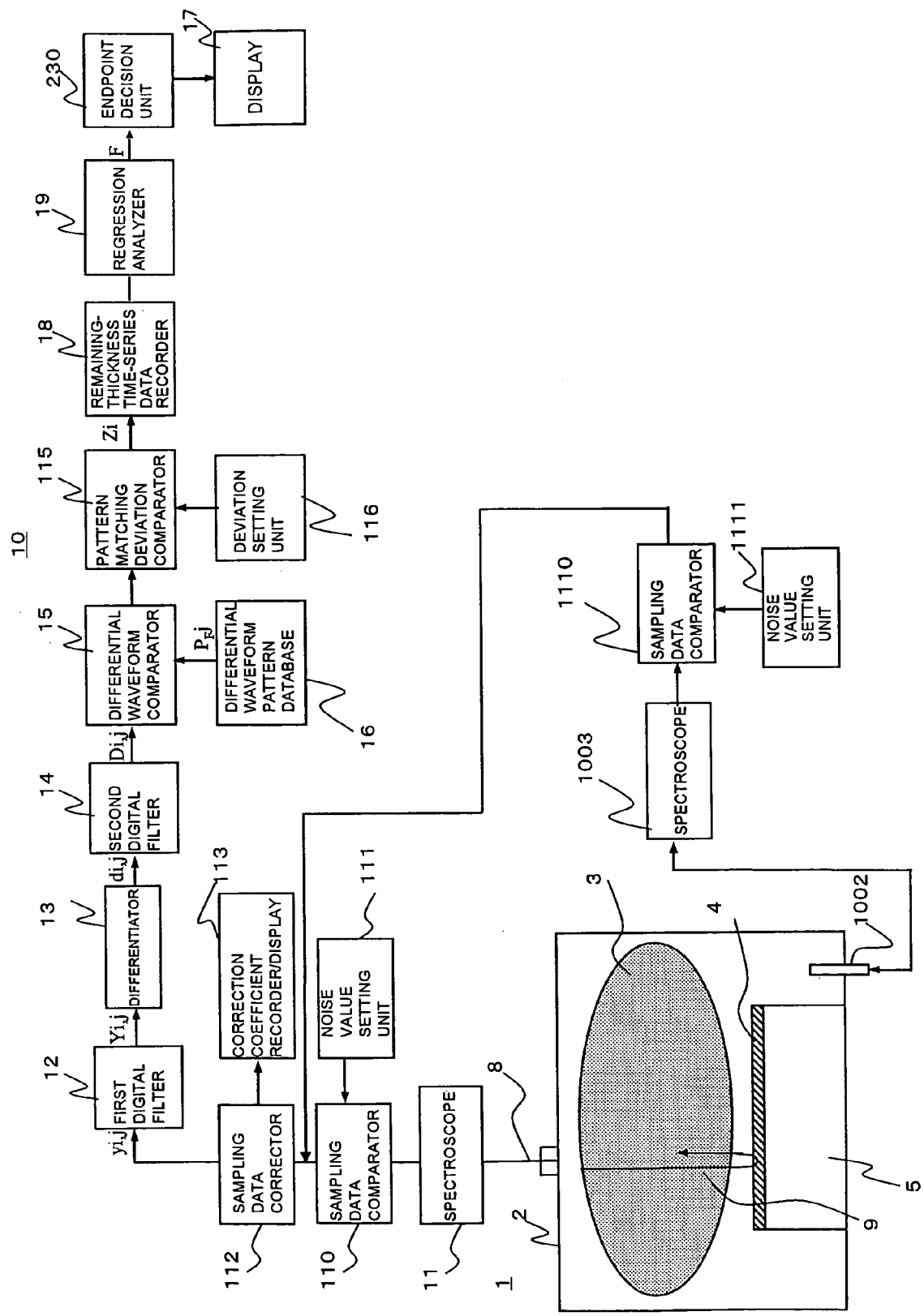
FIG. 13 is a block diagram showing the overall configuration of an etching apparatus of a semiconductor wafer according to a modification of Embodiment 5 of the present invention, the etching apparatus comprising the reference light measuring device.

The structural drawing of FIG. 11 shows means for processing interference light. In a modification of Embodiment 5, interference light is measured using plasma light instead of light from an external light source. As shown in FIG. 12, means for measuring interference light by using plasma radiation comprises plasma radiation measuring means 1001 disposed on the side wall of an etching container 2, a spectroscope 1003, a sampling data comparator 1110, a noise value setting unit 1111. Alternatively, as shown in FIG. 13, means for measuring plasma light may comprise plasma radiation measuring means 1002 disposed on the bottom of the etching container 2, the spectroscope 1003, the sampling data comparator 1110, the noise value setting unit 1111. These devices operate in a similar manner to the spectroscope 103, the sampling data comparator 110, the noise value setting unit 111, the sampling data corrector 112, and the correction coefficient recorder/display 113 which are shown in FIG. 11. The output from the sampling data comparator 1110 is outputted to the first digital filter 12 in a similar manner to the output of the sampling data corrector 112 shown in FIG. 11.

Figure 14:
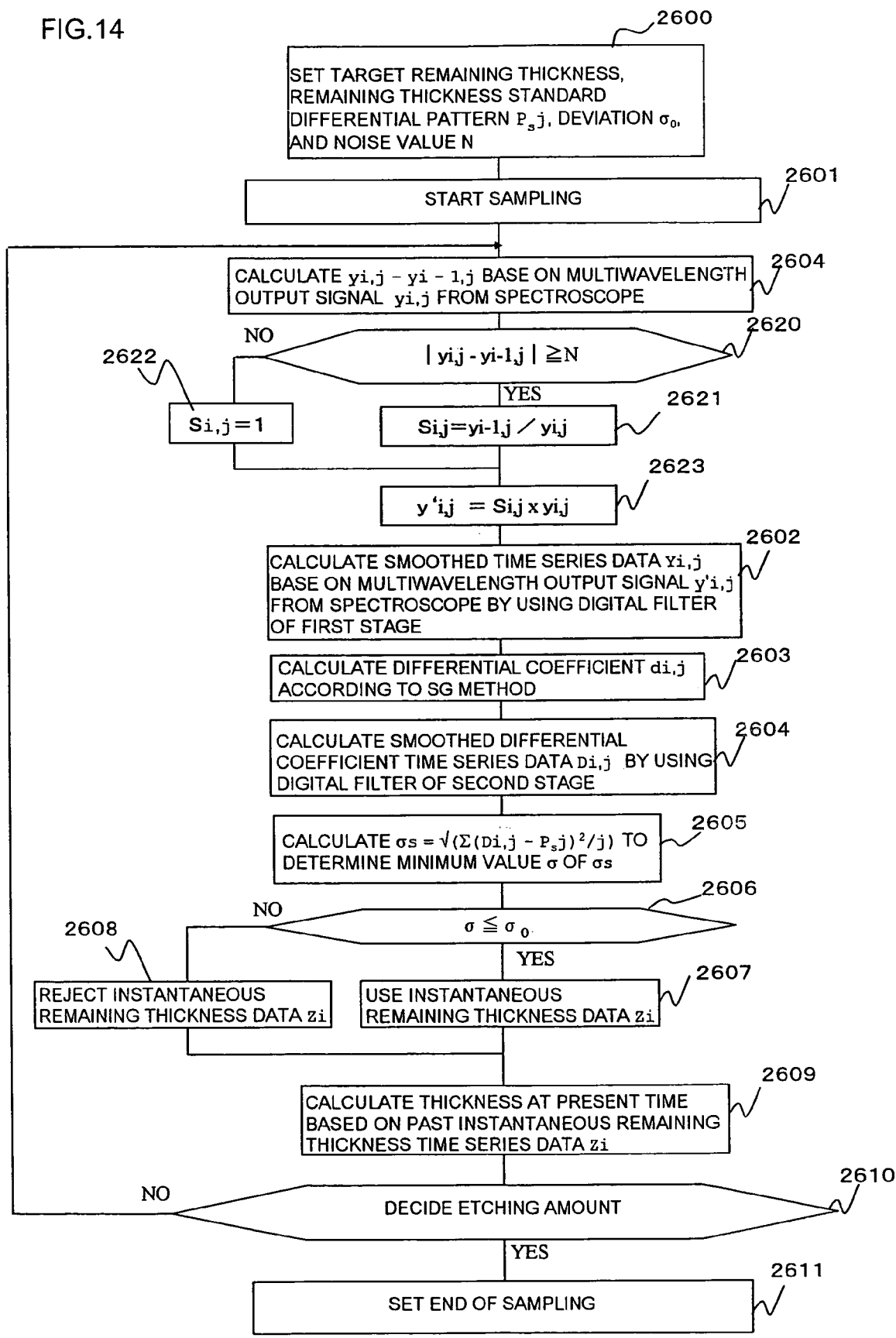
FIG. 14 is a flowchart showing the steps of determining the remaining thickness of a processed material when performing etching using the etching amount measuring device of FIG. 11.

Referring to the flowchart of FIG. 14, the following will discuss the steps of determining the etching amount of the processed material when performing etching in the etching amount measuring apparatus 10 of FIG. 11.

First, a target etching amount (target remaining thickness) is set, a differential pattern Psj with wavelength ranges (at least three wavelength ranges) extracted from a standard differential pattern database is set, a deviation $\sigma_0$ is set, and a noise value N is set (step 2600). In other words, a standard differential pattern is set beforehand in differential waveform pattern databases 15 and 25 so as to correspond to an etching amount s required for the processing conditions of a processed material.

In the subsequent step, sampling is started for interference light (for example, every 0.25 to 0.5 seconds) (step 2601). In other words, a sampling start command is issued in response to the start of etching. The radiant intensities of multiple wavelengths are detected by a photodetector as light detection signals of voltages corresponding to the radiant intensities. The radiant intensities change with the progress of etching. The light detection signals of the spectroscope 11 are converted to digital signals to obtain sampling signals yi,j at time i.

And then, a difference between the multiwavelength output signal yi,j from the spectroscope 11 and a signal yi−1,j at time i−1 is determined (step 2604). The sampling data comparator 110 decides whether the difference yi,j−yi−1,j is larger than the predetermined value N of the noise value setting unit 111 (step 2620). In the embodiments shown in FIG. 12 or 13, the sampling data comparator 1110 decides, like as in the embodiment of FIG. 11, whether the difference between the output signals relating to the plasma emission at time i−1 and i is larger than the predetermined value N of noise value setting unit 1111. When the difference is larger than the predetermined value N, a rate of change, that is, a correction coefficient is determined by Si,j=yi−1, j/yi,j (step 2621). When the difference is smaller, the correction coefficient is set at Si,j=1 (step 2622). The multiwavelength output signal yi,j from the spectroscope is corrected by the correction coefficient to y'i,j=Si,j×yi,j (step 2623). The correction coefficient is stored or displayed in the correction coefficient recorder/display 113 and used for mass production control of an etching process. The signal y'i,j having been corrected thus is transmitted to and smoothed by the digital filter 12 of the first stage to calculate time series data Yi,j (step 2602). In other words, noise is reduced by the digital filter of the first stage to determine the smoothed time series data Yi,j.

Subsequently, in the differentiator 13, a differential coefficient di,j is calculated according to SG method (step 2603). In other words, a coefficient (primary or secondary) di of a signal waveform is determined according to differentiation (SG method). Further, a digital filter circuit 14 of the second stage calculates smoothed differential coefficient time series data Di,j (step 2604). Then, $\sigma s = \sqrt{(\Sigma(Di,j - Psj)^2 / j)}$ is calculated in the differential waveform comparator 15 to determine the minimum value σ of the (minimum) matching pattern deviation σs relative to the thickness s (step 2605). Subsequently, in a pattern matching deviation comparator 115, whether $\sigma s \leq \sigma_0$ is satisfied (σs: (minimum) matching pattern deviation, $\sigma_0$: (set) matching pattern deviation) is decided (step 2606). In the case of $\sigma s \leq \sigma_0$, it is decided that the thickness of the processed material reaches the thickness s and the instantaneous thickness at time i is stored in a remaining-thickness time-series data recorder 18 (step 2607). When $\sigma s \leq \sigma_0$ is not satisfied, the instantaneous thickness at time i is not determined from the database of the standard differential pattern or is not stored in the remaining-thickness time-series data recorder 18 (step 2608). The smoothed differential coefficient time series data Di, j and the differential pattern Pzj set beforehand in the differential waveform comparator 15 are compared with each other and the remaining thickness Zi at that time is calculated (step 2615). And then, primary regression line Y=Xa×t+Xb (Y: remaining thickness, t: etching time, Xa: etching speed of absolute value, Xb: initial thickness) is determined by a regression analyzer 19 using time series data Zi having been stored in the past, and the remaining thickness F at time i (at the present time) is calculated based on the regression line (step 2609). Subsequently, in an endpoint decision unit 230, the remaining thickness F and the target remaining thickness are compared with each other. When the remaining thickness F is equal to or smaller than the target remaining thickness, it is decided that the etching amount of the processed material reaches a predetermined value and the result is displayed on the display 17 (step 2609). When the remaining thickness F is not smaller than the target remaining thickness, the process returns to step 2604. These steps are repeated. Finally the end of sampling is set (step 2611).

Referring to a specific example of the present invention, the following will discuss measurement of interference light when discharge fluctuates as shown in FIG. 4. Regarding the time variations of interference light and reference light of standard pattern data for deciding a thickness, the maximum amount of change at each time of sampling was determined as follows: during the etching of polysilicon (5 seconds to 55 seconds from the start of etching), the maximum amount of change of interference light is 50 counts and the maximum amount of change of reference light is 20 counts in the standard pattern data. Therefore, a noise threshold value for detecting a rapid change of plasma is set at 100 counts and 50 counts, which is a predeterminedly selected, according to apparatus's spec., in values of several times larger than the maximum amount of change.

Figure 15:
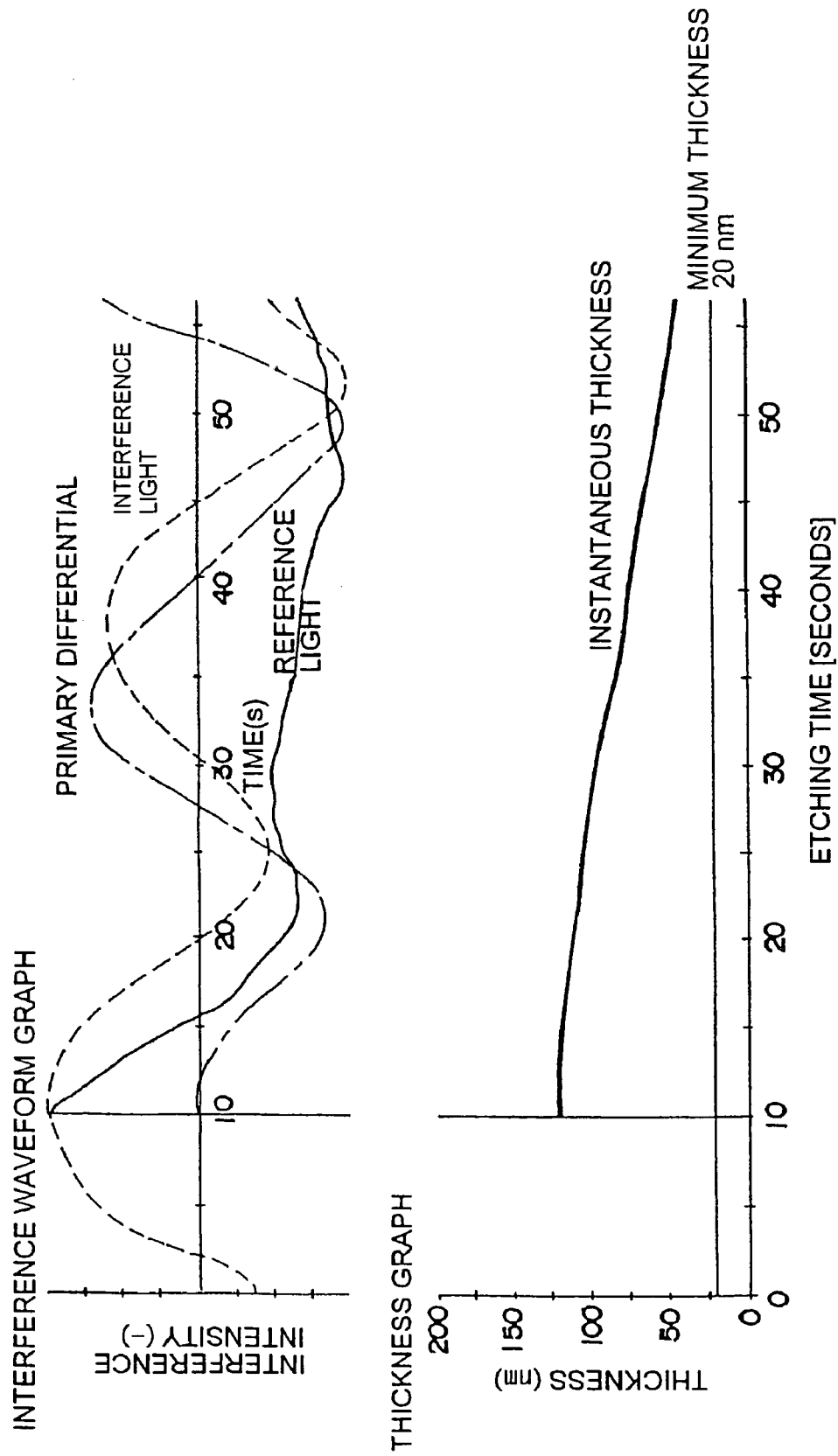
FIG. 15 is a diagram showing the results of the time variations of interference light and reference light and a change in thickness according to Embodiment 5 of the present invention.

FIG. 15 shows results obtained by performing the above processing to correct a rapid change of plasma. Radiation is changed at about 25 seconds after the start of etching as shown in FIG. 4 and the change is corrected as shown in FIG. 15. It is thus understood that the abnormal change of an interference light waveform and a reference light waveform is reduced. In this example, the noise (abnormal radiation) of the interference waveform was low and thus no change larger than the noise threshold value was found. However, the noise (abnormal radiation) of reference light is high and thus a change of plasma can be sufficiently detected. The reference light and interference light were corrected at that time. It is therefore possible to correct even a small change of interference light. This processing makes it possible to stably obtain a change of an instantaneous thickness during etching.

In this example, reference light is used as means for detecting a rapid change of plasma. The values of the reflection power of power for generating plasma and a matching point or the values of the reflection power of bias applied to a wafer and a matching point may be monitored and a change of the values may be used for the detection.

In this example, the correction coefficient is determined by $S_{i,j} = y_{i-1,j}/y_{i,j}$. An average of two or more waveform data before time i−1 may be used and an approximate value of time i−1 may be also used. The approximate value is determined from a smooth curve obtained by performing data interpolation such as Lagrange interpolation and spline interpolation on past time series data. Moreover, radiation data having been corrected by the correction efficient at time i may be further corrected using Lagrange interpolation or spline interpolation.

Furthermore, in the embodiments shown in FIG. 12 or 13, the sampling data of the interference light may be corrected by the correction efficient determined using the results in the sampling data comparator 1110 relating to the plasma emission, as like in the case using the interferencial light from the sample surface and its intensity. And still more, in the case of being detected the noise value at the arbitrary time larger than the threshold, the regression approximation above described may be used at the predetermined number of times at least one to calculate the remained film thickness, and the correction coefficient may be used to calculate the remained film thickness after the noise value is detected larger than the threshold at another time.

In normal etching, the number of times when the noise threshold value is exceeded is zero. The number of times increases when the etching characteristics of the etching devices changes with time and the state plasma degrades. Therefore, in mass production, the etching device can be controlled by displaying, on the display 17, the number of times when the noise threshold value is exceeded.

According to the present invention, it is possible to provide a method of measuring a thickness and a method of deciding a process endpoint using the same whereby the etching amount of a processed material can be correctly measured online in plasma processing, particularly in plasma etching.

Further, it is possible to provide an etching process by which the etched layer of a semiconductor device can be accurately controlled online with a predetermined etching amount. Moreover, it is possible to provide an etching amount measuring apparatus for a processed material whereby the actual etching amount of a processed layer can be accurately measured online.

What is claimed is:

1. A plasma processing apparatus for etching a film on a surface of a sample to a target remaining thickness by using plasma generated in the vacuum chamber, the sample being located in a vacuum chamber, the plasma processing apparatus, comprising:
   a detector which detects interference light of multiple wavelengths from the surface of the sample at plural time points during the etching processing of the film;
   a differentiator which differentiates a time change in intensity of the interference light of multiple wavelengths detected by the detector at each of the plural time points during the etching processing of the film so as to obtain an actual differential pattern of differential waveforms in the interference light from the sample;
   a differential waveform pattern database which stores a plurality of standard differential waveform patterns corresponding to a plurality of remaining thicknesses of the film, the standard differential waveform pattern being obtained, before the processing of the sample, by differentiating a time change in intensity of the interference light of multiple wavelengths during similar processing of another similar sample;
   a differential waveform comparator which compares the actual differential pattern to a plurality of standard differential patterns stored in the differential waveform pattern database, and outputs a minimum value of a pattern matching deviation;
   a pattern matching deviation comparator to compare the minimum pattern matching deviation obtained from differential wave form comparator to a predetermined minimum pattern matching deviation set by a deviation setting unit;
   a decision unit which decides that the remaining thickness indicated by the actual differential pattern is acceptable if the minimum value of the pattern matching deviation is not greater than the pre-determined value from the deviation setting unit and which decides that the remaining thickness indicated by the actual differential pattern is unacceptable if the minimum value of the pattern matching deviation is greater than the pre-determined value from the deviation setting unit, and a counter to keep track of the number of such occurrences and to display a warning if the rate of such occurrences increases to be more than a predetermined value;
   a remaining thickness time series data recorder which stores data values of instantaneous remaining thickness at each of the plural time points during the etching processing if the remaining thickness is indicated as acceptable; and
   if the remaining thickness indicated by the actual differential pattern is decided as being unacceptable, the decision unit decides to obtain the thickness of the film by extrapolation or regression analysis using the data values of instantaneous remaining thicknesses at the time points before the given time point during the etching process and stores the obtained thickness in the remaining-thickness time-series data recorder.

2. The plasma processing apparatus according to claim 1, further comprising a notifier which gives notification when a number of times when the minimum value of the pattern matching deviation obtained from the differential waveform comparator is equal to or less than a predetermined value of the pattern matching deviation set by the deviation setting unit exceeds a predetermined number of times.

* * * * *